(12) United States Patent
Uchida

(10) Patent No.: US 7,741,723 B2
(45) Date of Patent: Jun. 22, 2010

(54) SEMICONDUCTOR DEVICE COMPRISING CHIP ON CHIP STRUCTURE

(75) Inventor: Toshiya Uchida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 550 days.

(21) Appl. No.: 11/708,039

(22) Filed: Feb. 20, 2007

(65) Prior Publication Data

US 2008/0001305 A1 Jan. 3, 2008

(30) Foreign Application Priority Data

Jun. 30, 2006 (JP) .............................. 2006-181978

(51) Int. Cl.
*H01L 29/40* (2006.01)
(52) U.S. Cl. ................ 257/777; 257/686; 257/E23.001
(58) Field of Classification Search ................ 257/777, 257/E23.01, E21.001, 686, E23.001
See application file for complete search history.

(56) References Cited

U.S. PATENT DOCUMENTS

| 2002/0036338 A1* | 3/2002 | Matsuo et al. | ............... 257/686 |
| 2004/0201090 A1* | 10/2004 | Aigner et al. | ............... 257/686 |
| 2005/0156616 A1* | 7/2005 | Morishita et al. | ........... 324/763 |
| 2006/0050454 A1* | 3/2006 | Koudate et al. | ............... 361/56 |
| 2006/0220256 A1* | 10/2006 | Shim et al. | ................... 257/777 |

FOREIGN PATENT DOCUMENTS

| JP | 61-042942 A | 3/1986 |
| JP | 06-112401 A | 4/1994 |
| JP | 2000-332192 A | 11/2000 |
| JP | 2001-094037 A | 4/2001 |
| JP | 2005-039160 A | 2/2005 |
| JP | 2005-039161 A | 2/2005 |
| JP | 2005-109419 A | 4/2005 |
| WO | WO 01/73843 A1 | 10/2001 |

* cited by examiner

*Primary Examiner*—Bradley K Smith
*Assistant Examiner*—Mohammad T Karimy
(74) *Attorney, Agent, or Firm*—Fujitsu Patent Center

(57) ABSTRACT

In a semiconductor device constituted of stacked semiconductor chips, in order to independently test each of the chips, a second chip is disposed to face a first chip, with a second interconnection terminal thereof connected to a first interconnection terminal of the first chip. First and second external terminals of the first and second chips are formed on surfaces of the first and second chips, the surface being on a same side of the first and second chips. Therefore, even after the first chip and the second chip are pasted together, it is possible to test the first chip and the second chip while operating them independently. Further, since test probes or the like can be brought into contact with the external terminals of the first chip and the second chip from the same side, it is possible to simultaneously test the first chip and the second chip.

11 Claims, 26 Drawing Sheets

SEMICONDUCTOR DEVICE COMPRISING CHIP ON CHIP STRUCTURE

CROSS REFERENCE TO RELATED APPLICATION

This application is based upon and claims the benefit of priority from Japanese Patent Application No. 2006-181978, filed on Jun. 30, 2006, the entire contents of which are incorporated herein by reference.

BACKGROUND OF THE INVENTION

1. Field of the Invention

The present invention relates to a semiconductor device constituted of stacked semiconductor chips, adopting a Chip on Chip technology or the like.

2. Description of the Related Art

In recent years, a volume of data handled in system products such as mobile phones have dramatically increased. In accordance with this increase, capacities of semiconductor memories mounted in the system products have also increased and there has arisen a demand for semiconductor memories with a high data transfer rate. Generally, as a semiconductor device mounted in a system product of this type, there has been provided a System on Chip (SoC) in which a logic (controller) and memories are integrated on one chip, and a System in Package (SiP) in which a logic chip and a memory chip are stacked and sealed in one package. A semiconductor process of the SoC is complicated and also costs high. On the other hand, the SiP is formed by packaging a plurality of semiconductor chips each of which is manufactured by using an existing semiconductor process, and thus does not require the development of a new semiconductor process and is relatively low in manufacturing cost. Therefore, system products using the SiP have recently been on an increasing trend.

Further, a Chip on Chip (CoC) technology which connects chips by micro-bumps or the like in order to reduce a parasitic LCR and to increase a data transfer rate has been increasingly adopted for the SiP, as disclosed in, for example, Japanese Unexamined Patent Application Publication No. 2005-39160, Japanese Unexamined Patent Application Publication No. 2005-39161, Japanese Unexamined Patent Application Publication No. 2005-109419, Japanese Unexamined Patent Application Publication No. 2000-332192, Japanese Unexamined Patent Application Publication No. 2001-94037, and Japanese Unexamined Patent Application Publication No. Sho 61-42942.

In the CoC, when chips are connected to each other by micro-bumps or the like, element formed surfaces are made to face each other in most cases in order to reduce the parasitic LCR to the minimum. In this case, after the CoC is assembled, a surface of a semiconductor chip with a smaller chip size (small chip) is covered with a semiconductor chip with a larger chip size (large chip). This does not allow the direct connection of external terminals of the small chip to external terminals of a semiconductor device. Therefore, it is not possible to test the small chip alone if not through the large chip. Further, it is not possible to supply power to the small chip if not through the large chip.

SUMMARY OF THE INVENTION

It is an object of the present invention to make it possible to test semiconductor chips independently in a semiconductor device constituted of stacked semiconductor chips.

It is another object of the present invention to supply power to the semiconductor chips independently and improve an operation margin of each of the semiconductor chips in a semiconductor device constituted of stacked semiconductor chips.

According to one aspect of the present invention, a first chip has a first element formed area, a first interconnection terminal connected to a circuit formed in the first element formed area, and a first external terminal connecting the circuit formed in the first element formed area to an exterior of the semiconductor device. A second chip has a second element formed area, a second interconnection terminal connected to a circuit formed in the second element formed area, and a second external terminal connecting the circuit formed in the second element formed area to the exterior of the semiconductor device. The second chip is disposed to face the first chip via the second interconnection terminal connected to the first interconnection terminal. The first and second external terminals are formed on surfaces of the first and second chips. The surfaces are on a same side of the first and second chips. Therefore, even after the first chip and the second chips are pasted together, it is possible to operate the first chip and the second chip for testing independently. Further, since test probes or the like can be brought into contact with the external terminals of the first chip and the second chip from the same side, it is possible to simultaneously test the first chip and the second chip. Moreover, using the first and second external terminals makes it possible to supply independent power supplies to the first and second chips respectively. This can accordingly improve operation margins of the first and second chips.

To manufacture this semiconductor device, first, diced second chips are pasted on first chips in a wafer state to form a plurality of CoCs. Next, CoCs which normally operate are sorted out from the CoCs through testing. At this time, using the first and second external terminals for the test makes it possible not only to test the whole semiconductor device but also to test the first and second chips independently. As a result, the number of test patterns and the like can be reduced and the test time can be shortened. Next, semiconductor devices are formed by packaging each of the normally operating CoCs. Then, a normally operating semiconductor device is sorted out from the packaged semiconductor devices through testing.

According to another aspect of the present invention, a semiconductor device has a first chip and a second chip which are electrically connected to each other and face each other. The first chip has a first projection part which is part of an outer periphery of the first chip and protrudes from an outer periphery of the second chip. The second chip has a second projection part which is part of the outer periphery of the second chip and protrudes from the outer periphery of the first chip. The first and second projection parts have external terminals electrically connected to an exterior of the semiconductor device. Therefore, it is possible to independently test the first and second chips pasted together. Further, it is possible to supply independent power supplies to the first and second chips by using the first and second external terminals. As a result, operation margins of the first and second chips can be improved.

According to still another aspect of the present invention, a first chip has a first element formed area and a first external terminal. A wiring layer is disposed on the first chip and has an interconnection part and an external connection part. A second chip is disposed on the wiring layer, has a second element formed area, is smaller than the first chip, and has at least one second external terminal. The interconnection part of the wiring layer electrically connects the respective element formed areas of the first and second chips. The external connection part of the wiring layer is connected to the second external terminal, is electrically insulated from the first element formed area of the first chip, and has a projection part projecting outward from an outer periphery of the second chip. Therefore, even after the first chip and the second chip are pasted together, it is possible to operate the first chip and the second chip for testing independently, using the first external terminal and the second external terminal connected to the external connection part. Further, since test probes or the like can be brought into contact with the first external terminal and the external connection part from the same side, it is possible to simultaneously test the first chip and the second chip. Further, it is possible to supply independent power supplies to the first and second chips respectively by using the first and second external terminals. As a result, operation margins of the first and second chips can be improved.

To manufacture this semiconductor device, first, the wiring layer is formed on each first chip in a wafer state. Next, diced second chips are pasted thereon to form a plurality of CoCs. Next, CoCs which normally operate are sorted out from the CoCs through testing. At this time, it is possible not only to test the whole semiconductor devices but also to test the first and second chips independently by using the first and second external terminals (external connection terminals) for the test. As a result, the number of test patterns and the like can be reduced and the test time can be shortened. Next, each good CoC is packaged to form a semiconductor device. Then, a semiconductor device which normally operates is sorted out from the packaged semiconductor devices through testing.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described by using the drawings.

Figure 1:
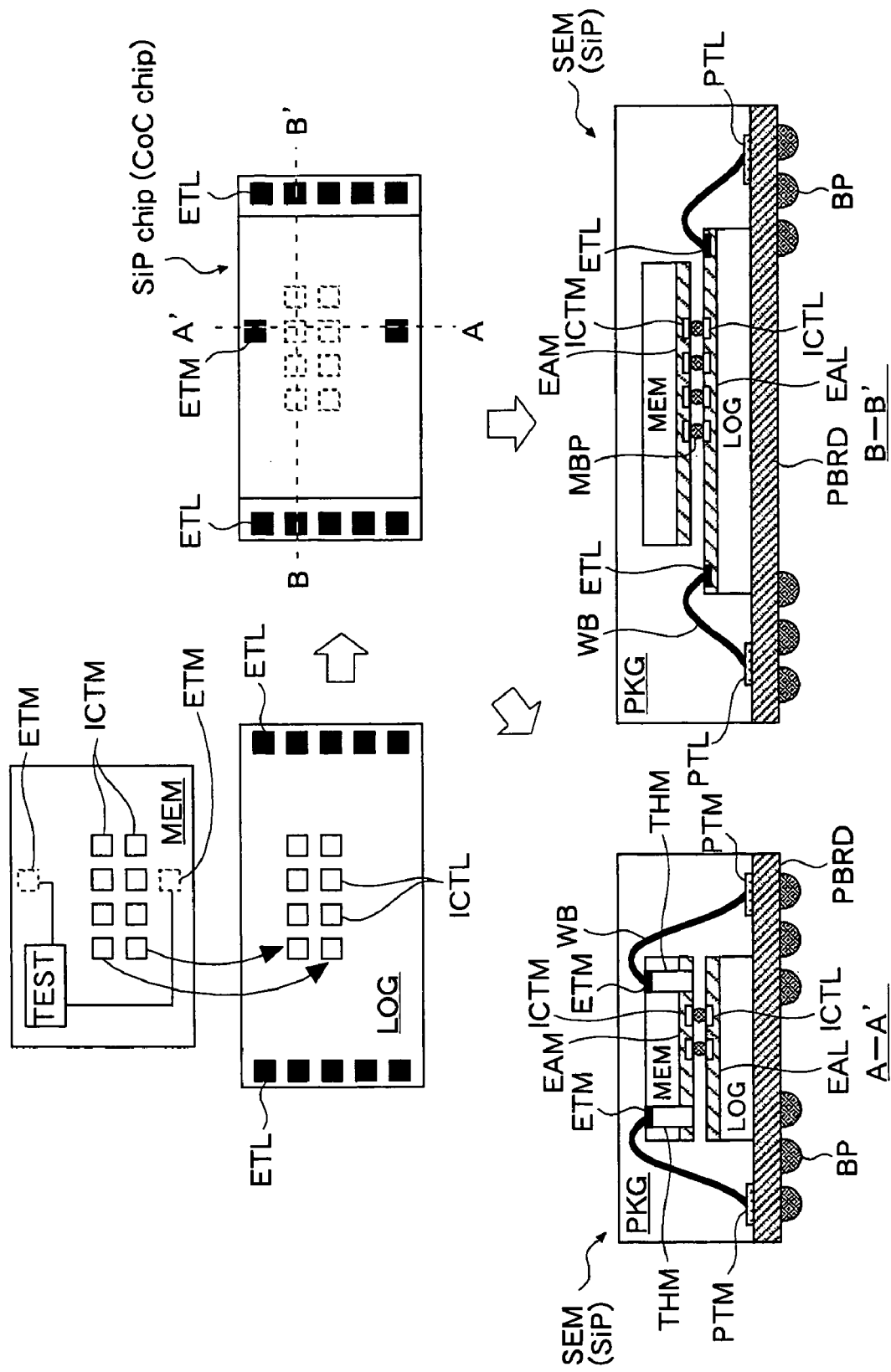
FIG. 1 is an explanatory view showing a first embodiment of the present invention.

FIG. 1 shows a first embodiment. A semiconductor device SEM is formed by using a Chip on Chip (hereinafter, referred to as CoC) technology in such a manner that a memory chip MEM (second chip) is pasted on a logic chip LOG (first chip) to constitute a System in Package (hereinafter, also referred to as a SiP) and the SiP chip (CoC chip) is sealed in a package PKG.

A length in a lateral direction in FIG. 1 of the logic chip LOG is larger than that of the memory chip MEM, and the logic chip LOG has a plurality of external terminals ETL at positions (in the right and left directions in FIG. 1) not overlapping with the memory chip MEM. The memory chip MEM has two external terminals ETM at positions overlapping with the logic chip LOG. The logic chip LOG and the memory chip MEM have a plurality of interconnection terminals ICTL, ICTM, respectively, connected to each other.

The memory chip MEM has, for example, a test circuit TEST. The test circuit TEST is, for example, a BIST (Built-In Self-Test) circuit. In response to test signals received at the external terminals ETM, the test circuit TEST starts its operation to test internal circuits (a memory array and a control circuit thereof) of the memory chip MEM. The test circuit TEST is prohibited from operating during a normal operation mode in which the memory chip MEM is accessed by the logic chip LOG. For example, when a voltage level of one of the external terminals ETM indicates an inactivation state, the memory chip MEM maintains the normal operation mode, and in response to the activation of the voltage level of this external terminal ETM, it shifts from the normal operation mode to a test mode, in which the operation test of the memory chip MEM is conducted. The other external terminal ETM is used in selecting one of tests of, for example, two kinds. Thus, the external terminals ETM function as test terminals. In a case where the test circuit TES conducts one kind of test, the number of the test terminals (external terminals ETM) may be one. Alternatively, in a case where there are many kinds of tests, the number of the test terminals may be increased to three or more. Further, an external terminal ETM outputting test results may be formed.

The test circuit TEST is not limited to the BIST circuit. For example, in a case where redundancy memory cells for failure relief (redundancy word lines or redundancy bit lines) and fuses for replacing normal memory cells (normal word lines or normal bit lines) by the redundancy memory cells are formed in the memory chip MEM, the test circuit TEST may include a redundancy circuit programming the fuses in order to replace a memory cell, which is determined as defective by the test, by the redundancy memory cell.

As shown in A-A' and B-B' cross sections in FIG. 1, the logic chip LOG and the memory chip MEM are assembled into a SiP chip, with element formed areas EAL, EAM facing each other. Here, the element formed areas EAL, EAM are areas where elements such as transistors and resistors are formed. Hereinafter, surfaces where the element formed areas EAL, EAM are formed will be referred to as front surfaces and the opposite surfaces will be referred to as rear surfaces. The interconnection terminals ICTL are connected to not-shown circuits formed in the element formed area EAL. The interconnection terminals ICTM are connected to not-shown circuits formed in the element formed area EAM. The interconnection terminals ICTL, ICTM are electrically connected to each other via micro-bumps MBP or the like (conductive connection members).

As shown in the B-B' cross section on the right In FIG. 1, the external terminals ETL of the logic chip LOG are formed on the front surface of the logic chip LOG. The external terminals ETL are connected to the not-shown circuits of the element formed area EAL. The circuits of the logic chip LOG include a memory control circuit controlling the operation of the memory chip MEM. The external terminals ETL include a power supply terminal and are bonded to terminals PTL of a package PKG via metal wires WB or the like.

As shown in the A-A' cross section on the left in FIG. 1, the external terminals ETM of the memory chip MEM are formed on the rear surface of the memory chip MEM. The external terminals ETM are connected to the test circuit TEST of the element formed area EAM via through holes THM. The through holes THM penetrate from the element formed area EAM up to the external terminals ETM, and are filled with, for example, a conductive material. The external terminals ETM are bonded to terminals PTM of the package PKG via metal wires WB or the like. The terminals PTL, PTM are connected to bumps BP formed on an underside of a package board PBRD. The bumps BP are external terminals of the semiconductor device SEM, and are connected to terminals of a not-shown system board.

The external terminals ETL of the logic chip LOG and the external terminals ETM of the memory chip MEM are formed on surfaces, of the logic chip LOG and the memory chip MEM, which face the same side (upper side of the A-A' cross section and the B-B' cross section in FIG. 1) in a state where the logic chip LOG and the memory chip MEM are assembled into the SiP chip. Therefore, by supplying test signals to the external terminals ETM, it is possible to independently test the memory chips MEM in a state where the memory chips MEM are pasted on the logic chips LOG in a wafer state. Using the external terminals ETL makes it possible to independently test the logic chip LOG. Therefore, the memory chip MEM and the logic chip LOG can be tested independently and simultaneously. Moreover, after the SiP is assembled, the memory chip MEM can be independently tested. Since the through holes THM connecting the external terminals ETM to the element formed area EAM are formed, it is possible to independently test the memory chip MEM even in a case where the front surface of the memory chip MEM is completely covered with the logic chip LOG in the state where the SiP is assembled, that is, even in a case where the memory chip MEM is smaller than the logic chip LOG.

The external terminals ETL receive, from an exterior of the semiconductor device SEM, signals causing the logic chip LOG to operate, or the external terminals ETL output signals of the logic chip LOG. When accessing the memory chip MEM, the logic chip LOG uses the interconnection terminals ICTL, ICTM to output a command signal, an address signal, and a write data signal to the memory chip MEM and to receive a read data signal from the memory chip MEM. The exchange of the command signal, the address signal, and the data signals is executed by the memory control circuit of the logic chip LOG. As described above, the memory chip MEM operates in response to the signals supplied to the interconnection terminals ICTL, ICTM during the normal operation mode.

Figure 2:
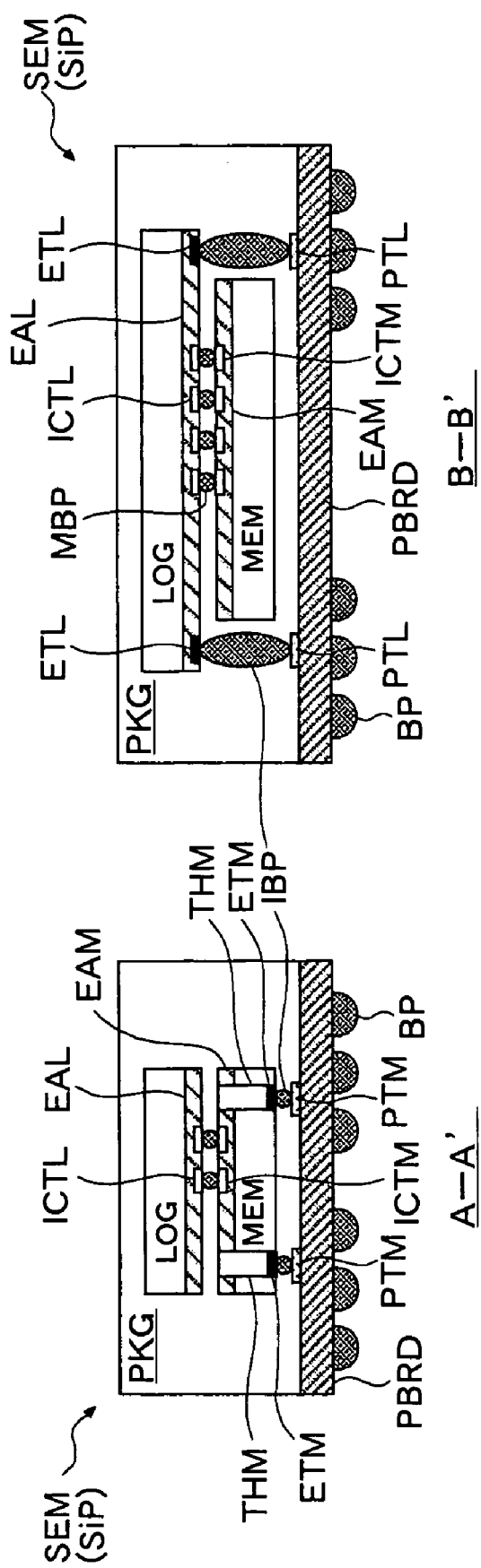
FIG. 2 is an explanatory view showing an example where a SiP chip shown in FIG. 1 is sealed in another package.

FIG. 2 shows an example where the SiP chip shown in FIG. 1 is sealed in another package PKG. The A-A' and B-B' cross sections in FIG. 2 correspond to those in FIG. 1. In this example, contrary to FIG. 1, the memory chip MEM is disposed on a package board PBRD side, and bumps IBP are formed on the external terminals ETL, ETM. The external terminals ETL, ETM are connected to the terminals PTL, PTM of the package board PBRD via the bumps IBP. Incidentally, the shape of the bumps IBP formed on the external terminals ETL is actually substantially spherical.

Figure 3:
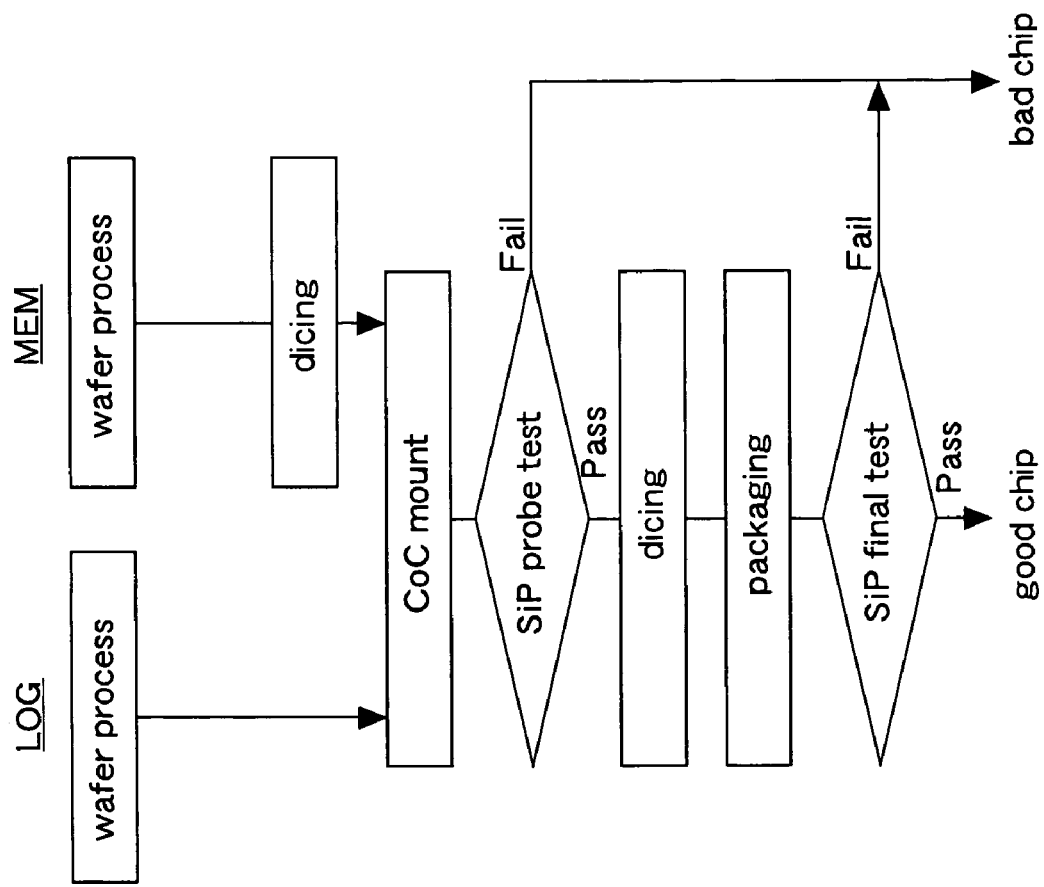
FIG. 3 is a flowchart showing a manufacturing method of a semiconductor device of the first embodiment.

FIG. 3 shows a manufacturing method of the semiconductor device SEM of the first embodiment. The memory chip MEM and the logic chip LOG are manufactured by using different wafer processes (manufacturing processes). After being manufactured, a wafer on which memory chips MEM are formed is diced to be separated into independent memory chips MEM. For example, each of the memory chips MEM is relatively small in memory capacity and small in chip size. Further, the memory chips MEM are manufactured by using an old-generation wafer process. Therefore, a yield of the memory chips MEM after the wafer is fabricated is, for example, 98%. Since nearly all the memory chips MEM are good chips, not conducting any probe test before the memory chips MEM are diced apart gives only a small influence to manufacturing cost. In particular, in the present invention, since the memory chips MEM can be independently tested in a state of the SiP chips, it is possible to test the memory chips MEM after the SiP chips are assembled, which can reduce the total time necessary for the test.

Next, the memory chips MEM which are diced apart are pasted on logic chips LOG in a wafer state, whereby a plurality of SiP chips are formed (CoC mount). The SiP chips in the wafer state are subjected to a probe test to be sorted into good chips and bad chips. At this time, the memory chips MEM can be independently tested by using the external terminals ETM shown in FIG. 1, which can improve efficiency of the test. Concretely, by simultaneously testing the logic chips LOG and the memory chips MEM by using the external terminals ETL, ETM, it is possible to shorten the test time. On the other hand, conventionally, the memory chips MEM have been tested indirectly by using the external terminals ETL of the logic chips LOG. Therefore, in the SiPs adopting the CoC technology, it has not been possible to simultaneously test the memory chips MEM and the logic chips LOG.

After the probe test, the SiP chips in a wafer state are diced apart, and only SiP chips determined as good chips by the probe test are packaged, whereby SiPs (semiconductor devices SEM) are completed. Then, the SiPs are sorted into good SiPs and bad SiPs by a final test. Incidentally, as shown in FIG. 1 and FIG. 2, by connecting the external terminals ETM of the memory chip MEM to the external terminals BP of the semiconductor device SEM, it is possible to directly test the memory chip MEM not through the logic chip LOG, even in a state where the memory chip MEM and the logic chip LOG are assembled into the SiPs. Therefore, failure analysis and the like of the memory chip MEM can be facilitated. Incidentally, in a case where the memory chip MEM is tested only in the manufacturing process, it is not necessary to connect the external terminals ETM to the external terminals BP of the semiconductor device SEM. In this case, the number of the external terminals BP can be reduced and the package size can be reduced. Further, the external terminals ETM may be connected to the external terminals BP of the semiconductor device SEM only in a prototype package used at the time of development of the semiconductor device SEM.

Figure 4:
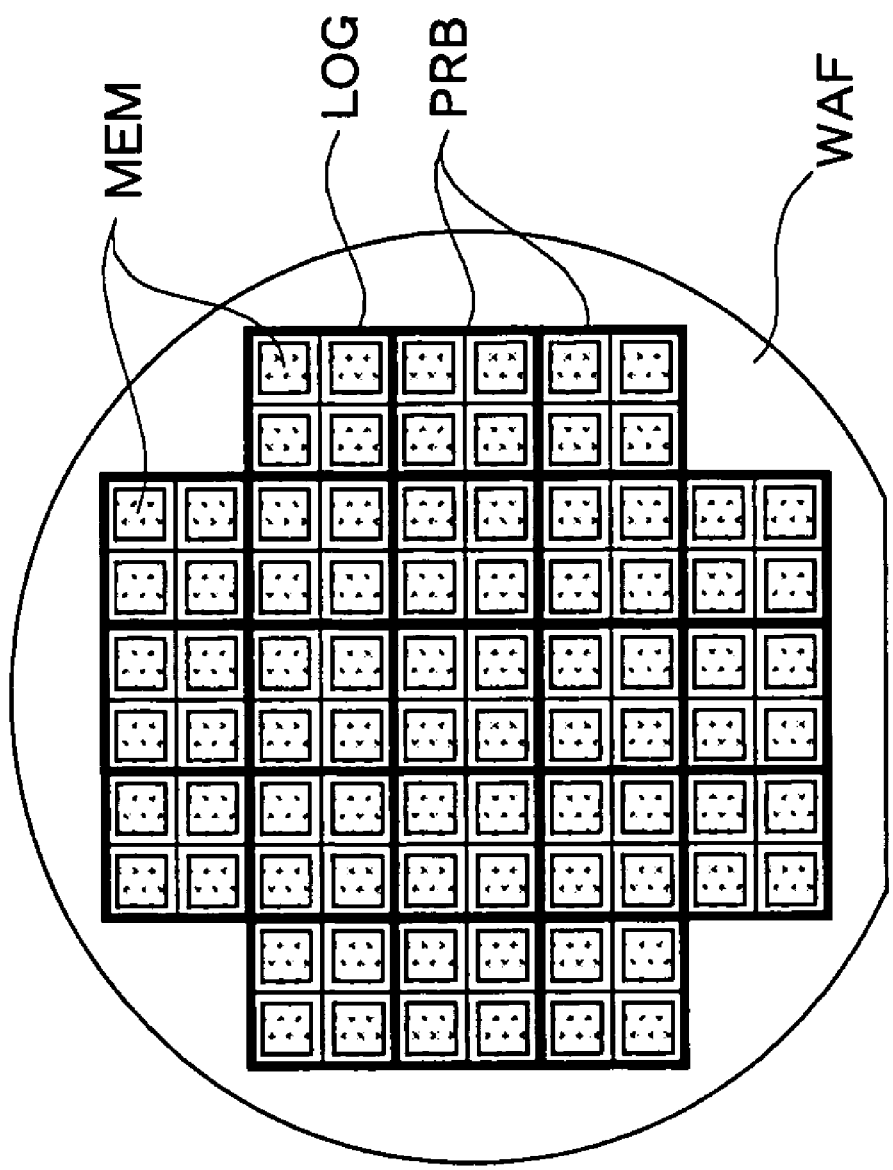
FIG. 4 is a plane view showing a wafer of logic chips after CoC mount shown in FIG. 3.

FIG. 4 shows a wafer of the logic chips LOG after the CoC mount shown in FIG. 3. The hatched chips in FIG. 4 are the memory chips MEM and are mounted on the logic chips LOG. Each of the heavy-line square frames PRB surrounding the four SiP chips in FIG. 4 shows a range whose SiP chips are simultaneously tested. In this example, in a case where any of the logic chips LOG in the square frame PRB is a bad chip, the four SiP chips are also always subjected to the probe test simultaneously. In other words, in a probe test step of the SiP chips, all the logic chips LOG are tested. This can eliminate a need for the probe test after the wafer process of the logic chips LOG, as shown in FIG. 3. Especially in a case where a yield of the logic chips LOG is relatively high, omitting the probe test of the logic chips LOG makes it possible to reduce the total time necessary for the test.

As described above, in the first embodiment, it is possible to independently operate the logic chip LOG and the memory chip MEM to test them even after the memory chip MEM is pasted on the logic chips LOG. Further, since test probes or the like can be brought into contact with the external terminals ETL, ETM of the logic chip LOG and the memory chip MEM from the same side, it is possible to simultaneously test the logic chip LOG and the memory chip MEM.

Figure 5:
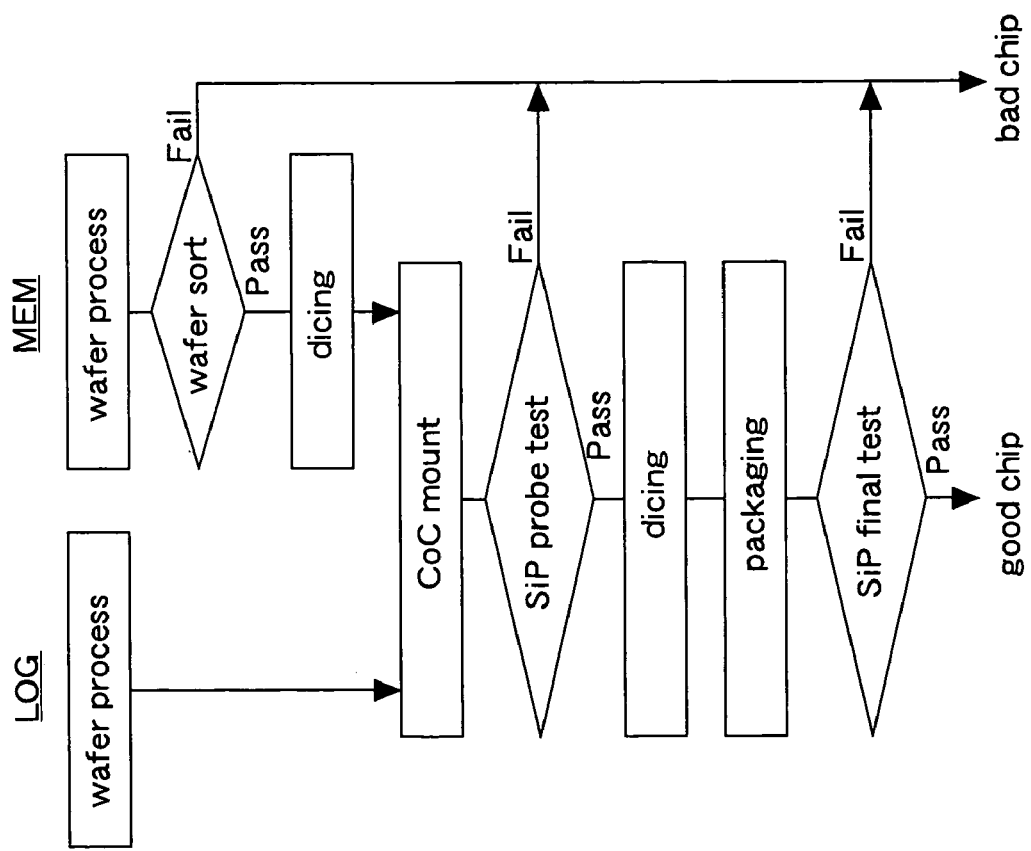
FIG. 5 is a flowchart showing a manufacturing method of a semiconductor device in a second embodiment of the present invention.

FIG. 5 shows a manufacturing method of a semiconductor device in a second embodiment of the present invention. The same reference numerals and symbols are used to designate the same elements as the elements described in the first embodiment, and detailed description thereof will be omitted. In this embodiment, before memory chips MEM (second chips) are diced apart, a wafer sort step is inserted. The other steps are the same as those of the first embodiment. The manufactured semiconductor device is the same as that in FIG. 1.

The flow in FIG. 5 is adopted when a yield of the memory chips MEM after a wafer is fabricated is lower than that in the first embodiment. A possible reason for the low yield of the memory chips MEM is that chip size is large or a new-generation wafer process is adopted. In the wafer sort step, a probe test of the memory chips MEM in a wafer state is conducted, and the memory chips MEM are sorted into good chips and bad chips. Then, after the memory chips MEM are diced apart, only memory chips MEM which normally operate (good chips) are pasted on logic chips LOG (first chips) in a wafer state, whereby a plurality of SiP chips are formed (CoC mount) as in the first embodiment (FIG. 3).

The above-described second embodiment can also provide the same effects as those of the first embodiment previously described. In addition, in this embodiment, since only the memory chips MEM which normally operate are pasted on the logic chips LOG in a case where the yield of the memory chips MEM after the wafer is fabricated is low, it is possible to improve the yield of the SiP chips, resulting in a reduction in manufacturing cost of the semiconductor device SEM.

Figure 6:
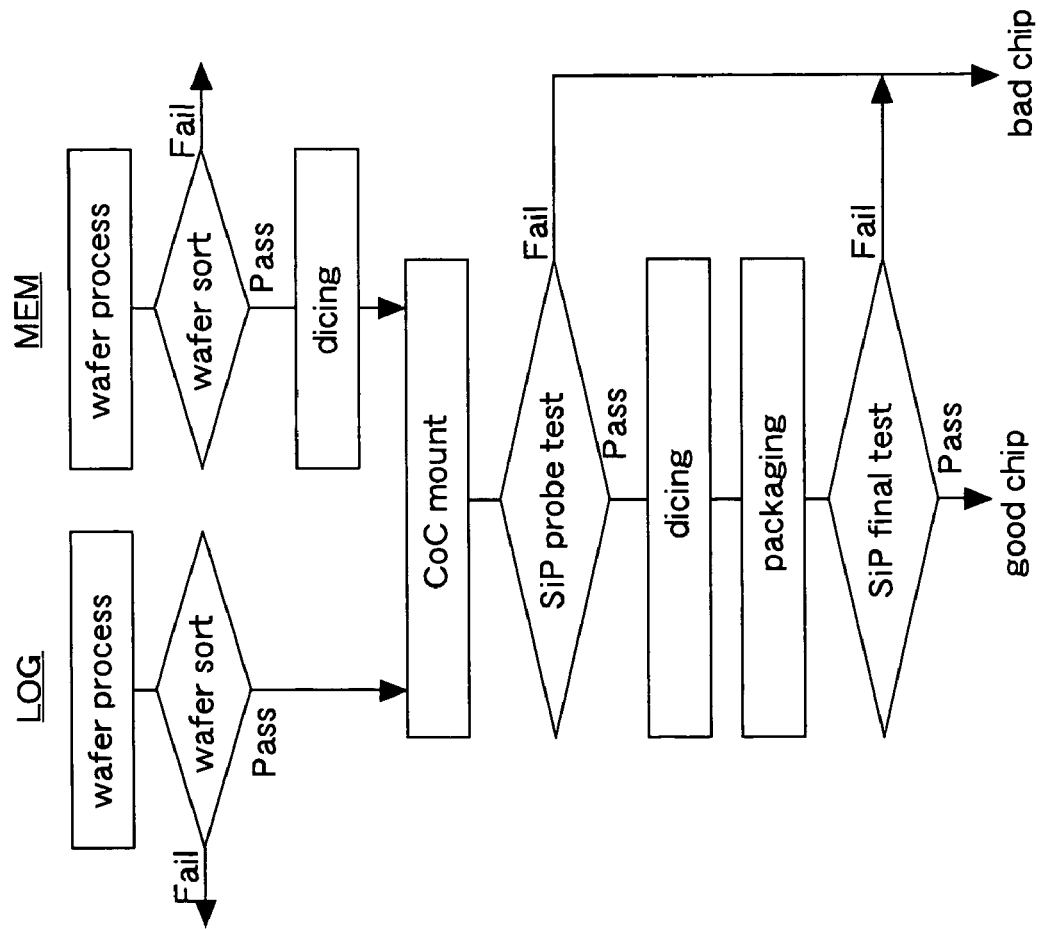
FIG. 6 is a flowchart showing a manufacturing method of a semiconductor device in a third embodiment of the present invention.

FIG. 6 shows a manufacturing method of a semiconductor device in a third embodiment of the present invention. The same reference numerals and symbols are used to designate the same elements as the elements described in the first and second embodiments, and detailed description thereof will be omitted. In this embodiment, a wafer sort step is inserted before memory chips MEM (second chips) are diced apart, and a wafer sort step is inserted after a wafer process of logic chips LOG (first chips). The other steps are the same as those of the first embodiment. The manufactured semiconductor device is the same as that in FIG. 1.

The flow in FIG. 6 is adopted when yields of the memory chips MEM and the logic chips LOG after wafers are fabricated are lower than those in the first embodiment. In the wafer sort steps, a probe test of the memory chips MEM (or the logic chips LOG) in a wafer state is conducted, and the chips are sorted into good chips and bad chips. Then, only memory chips MEM which normally operate (good chips) are pasted on normally operating logic chips LOG (first chip) in a wafer state, whereby a plurality of SiP chips are formed (CoC mount) as in the first embodiment (FIG. 3). Incidentally, in a case where the yield of the memory chips MEM is high, the wafer sort step of the memory chips MEM may be omitted as in the first embodiment.

Figure 7:
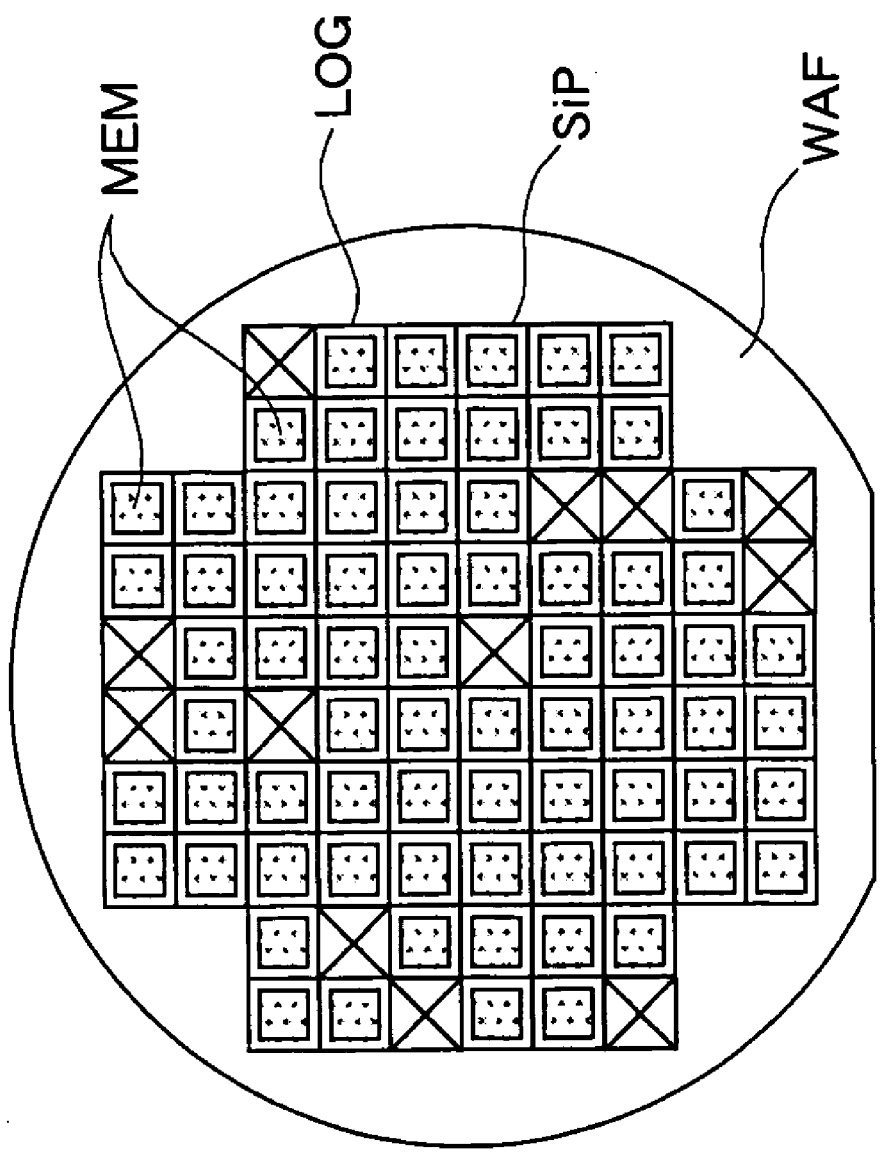
FIG. 7 is a plane view showing a wafer of logic chips after CoC mount shown in FIG. 6.

FIG. 7 shows a wafer of the logic chips LOG after the CoC mount shown in FIG. 6. The hatched chips in FIG. 7 are the memory chips MEM mounted on the logic chips LOG. In this embodiment, the memory chips MEM are not mounted on the bad logic chips LOG (marked with X in FIG. 7). A probe test is conducted on each of the SiP chips separately.

The third embodiment described above can also provide the same effects as those of the first and second embodiments previously described. In addition, in this embodiment, since the memory chips MEM are mounted on the logic chips LOG which normally operate and the probe test is conducted only on the SiP chips excluding the SiP chips corresponding to the bad logic chips LOG, efficiency of the probe test can be improved and manufacturing cost of the semiconductor device SEM can be reduced.

Figure 8:
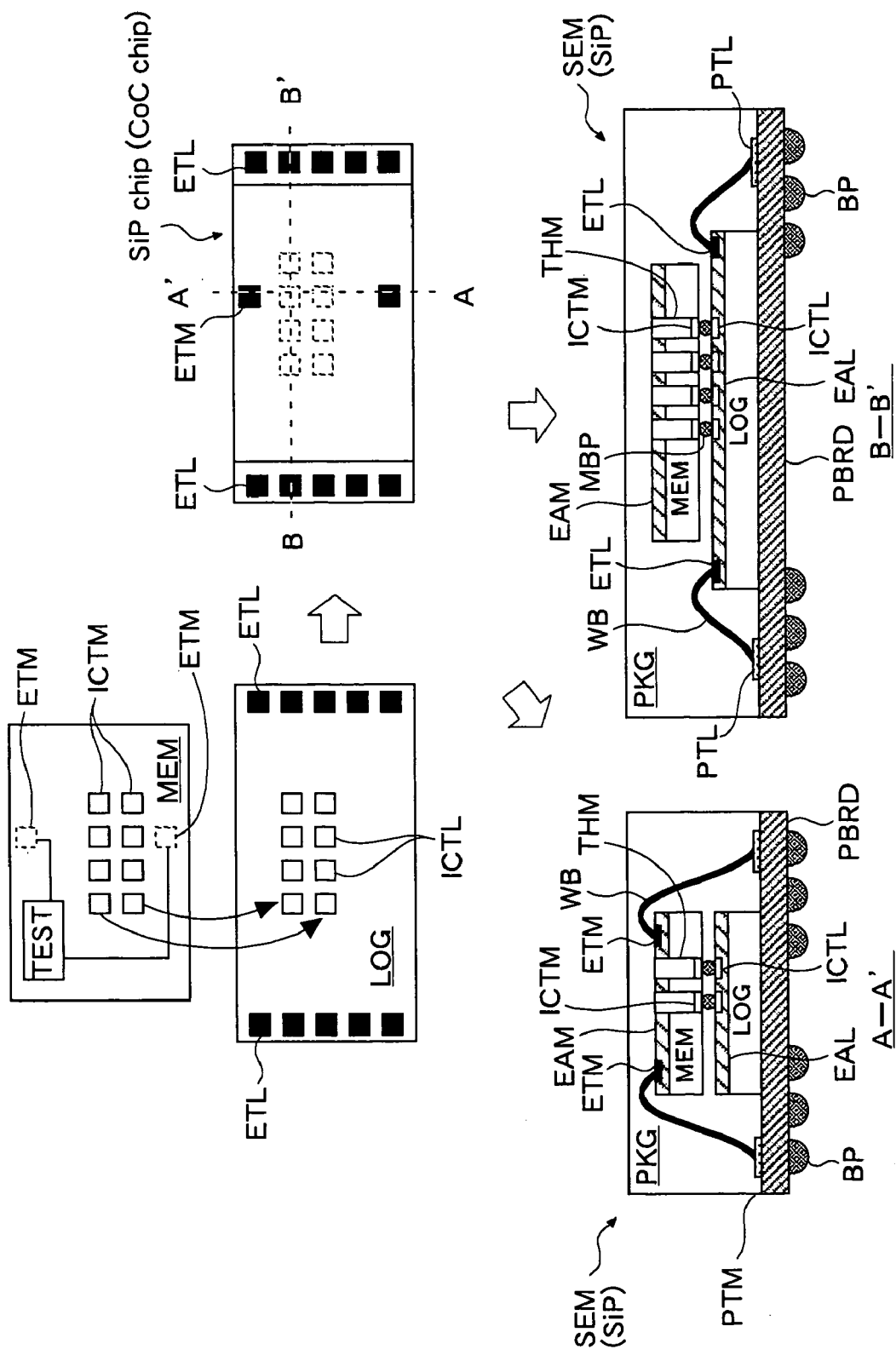
FIG. 8 is an explanatory view showing a fourth embodiment of the present invention.

FIG. 8 shows a fourth embodiment of the present invention. The same reference numerals and symbols are used to designate the same elements as the elements described in the first embodiment, and detailed description thereof will be omitted. In this embodiment, the structure of a memory chip MEM is different from that of the first embodiment. The other structure is the same as that of the first embodiment.

As shown in the A-A' and B-B' cross sections in FIG. 8, external terminals ETM of the memory chip MEM are formed in an element formed area EAM. In a SiP chip, the element formed area EAM of the memory chip MEM is formed on a surface opposite a surface facing a logic chip LOG (first chip). Further, the memory chip MEM has through holes THM for connecting interconnection terminals ICTM to the element formed area EAM.

The fourth embodiment described above can also provide the same effects as those of the first embodiment previously described.

Figure 9:
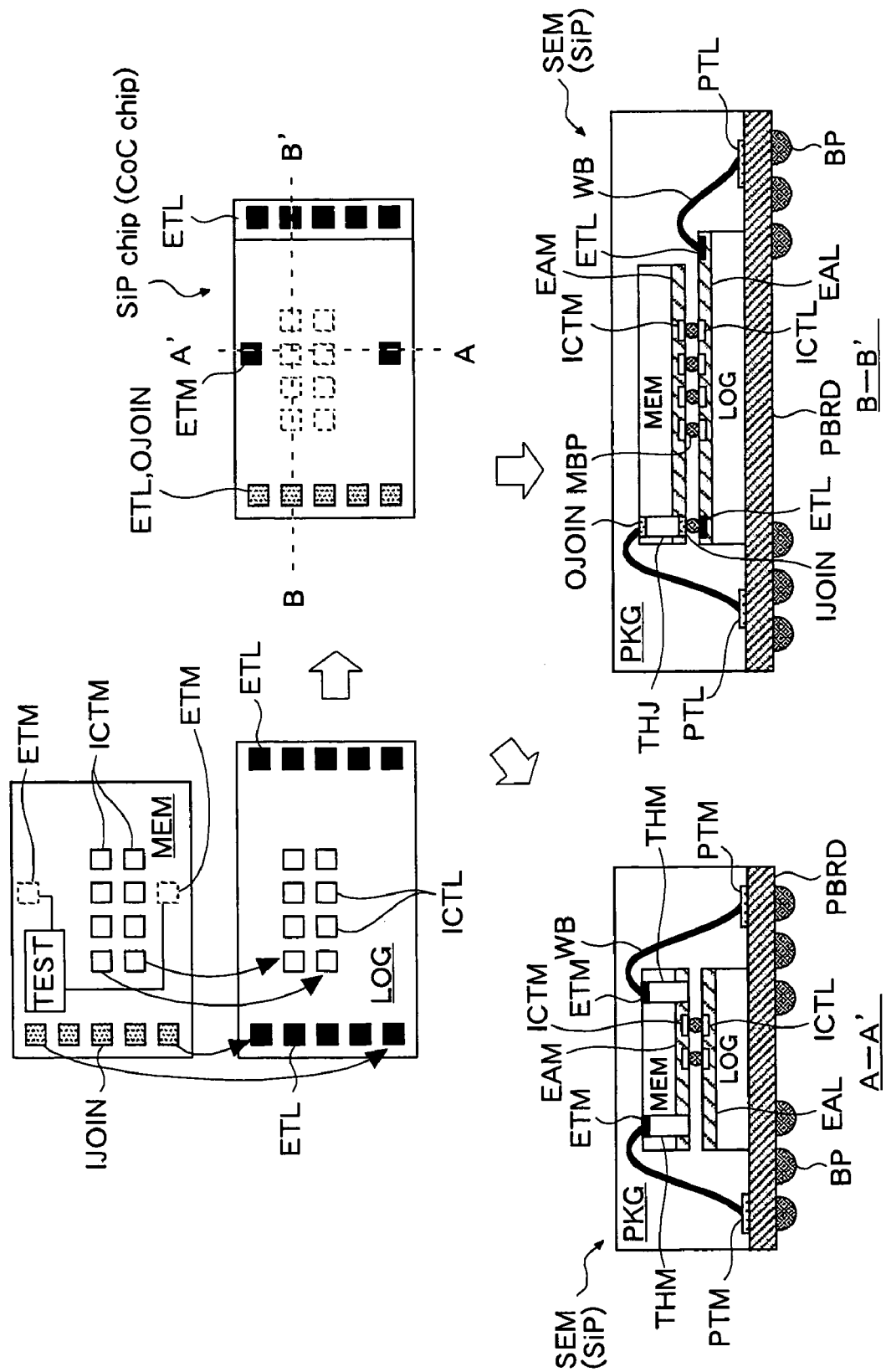
FIG. 9 is an explanatory view showing a fifth embodiment of the present invention.

FIG. 9 shows a fifth embodiment of the present invention. The same reference numerals and symbols are used to designate the same elements as the elements described in the first embodiment, and detailed description thereof will be omitted. In this embodiment, the structure of a memory chip MEM is different from that of the first embodiment. The other structure is the same as that of the first embodiment.

A length in a lateral direction in FIG. 9 of the memory chip MEM is larger than that of the first embodiment. Therefore, in a state where the memory chip MEM (second chip) is pasted on a logic chip LOG (first chip), part of external terminals ETL (left ETLs in FIG. 9) of the logic chip LOG are covered with the memory chip MEM. In order to connect the external terminals ETL to external terminals BP of a semiconductor device SEM, the memory chip MEM has internal joint terminals IJOIN, through holes THJ, and external joint terminals OJOIN as shown in the B-B' cross section in FIG. 9.

The internal joint terminals IJOIN are formed in an element formed area EAM and are connected to the external terminals ETL of the logic chip LOG via micro-bumps MBP. The external joint terminals OJOIN are formed on a rear surface of the memory chip MEM and are connected to the internal joint terminals IJOIN via the through holes THJ. With this structure, the external terminals ETL can be connected to an exterior of the semiconductor device SEM via the external joint terminals OJOIN.

The fifth embodiment described above can also provide the same effects as those of the first embodiment previously described. In addition, it is possible to connect the external terminals ETL to the exterior of the semiconductor device SEM even in a case where the memory chip MEM is large in size and the external terminals ETL of the logic chip LOG are covered with the memory chip MEM in a state where a SiP is assembled.

Figure 10:
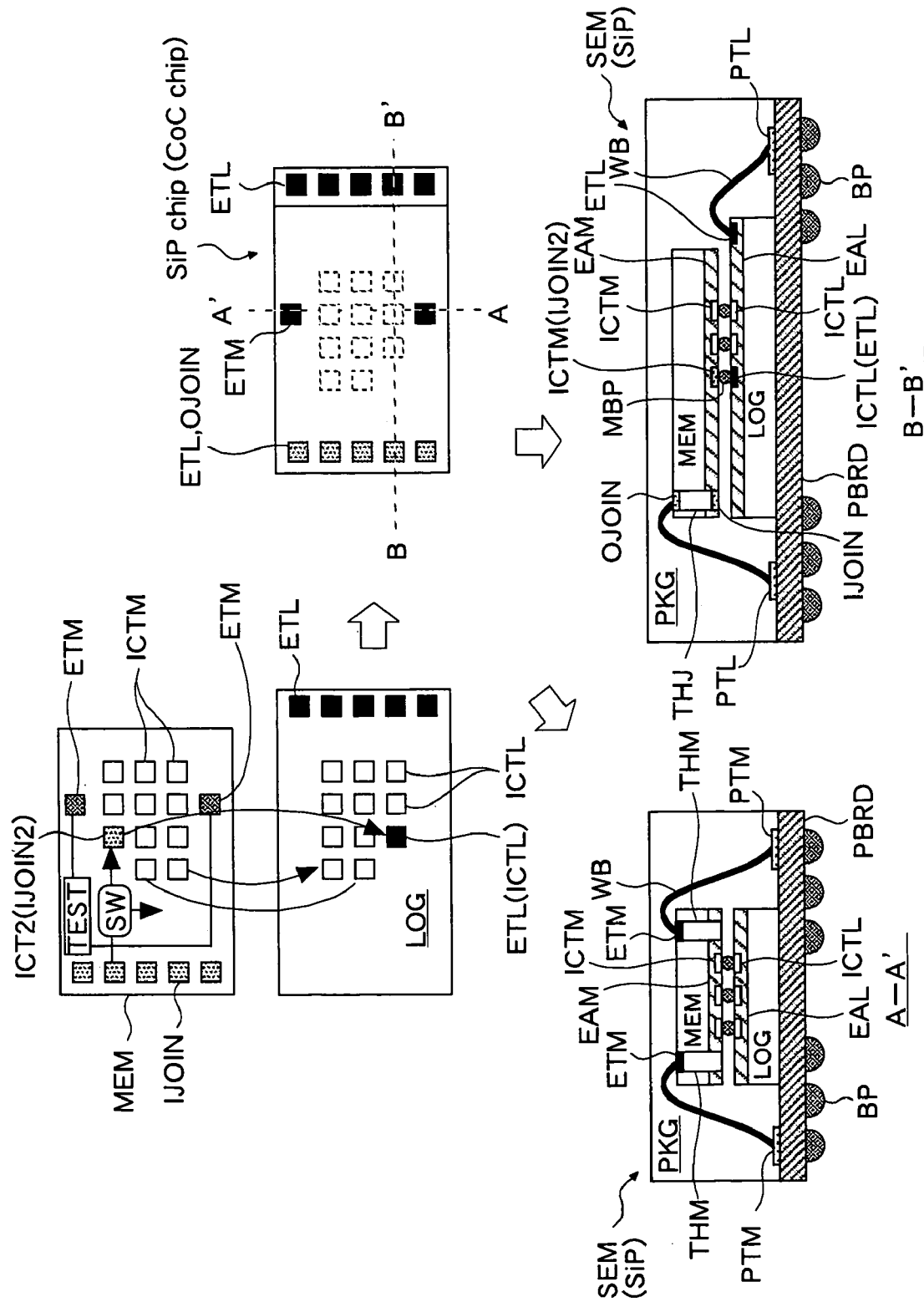
FIG. 10 is an explanatory view showing a sixth embodiment of the present invention.

FIG. 10 shows a sixth embodiment of the present invention. The same reference numerals and symbols are used to designate the same elements as the elements described in the first and fifth embodiments, and detailed description thereof will be omitted. In this embodiment, the structure of a memory chip MEM and the positions of external terminals ETL of a logic chip LOG are different from those of the first embodiment. The other structure is the same as that of the first embodiment.

As in the fifth embodiment (FIG. 9), the memory chip MEM (second chip) has internal joint terminals IJOIN, through holes THJ, and external joint terminals OJOIN in order to connect the external terminals ETL of the logic chip LOG (first chip) to an exterior of a semiconductor device SEM via the memory chip MEM. Further, the memory chip MEM has switch circuits SW for connecting the internal joint terminals IJOIN selectively either to internal circuits or to internal joint terminals IJOIN2. Though not specifically shown, the switch circuits SW and the internal joint terminals IJOIN2 are formed for the respective internal joint terminals IJOIN. The internal joint terminals IJOIN2 function as interconnection terminals ICTM which are connected to interconnection terminals ICTL of the logic chip LOG via micro-bumps MBP. Further, the interconnection terminals ICTL connected to the internal joint terminals IJOIN2 function as the external terminals ETL connected to the exterior of the semiconductor device SEM.

In this embodiment, at the time when the memory chip MEM is tested, the switch circuits SW are connected to the internal circuits of the memory chip MEM. In this case, the external joint terminals OJOIN function as test terminals (for example, a test command terminal, a test address terminal, and a test data terminal) through which the memory chip MEM is accessed. This structure enables a more detailed test, compared with a case where a BIST function of a test circuit TEST is used. On the other hand, when the logic chip LOG is tested and when the semiconductor device SEM is operated, the switch circuits SW are connected to the internal joint terminals IJOIN2. In this case, the external joint terminals OJOIN function as the external terminals ETL of the logic chip LOG. Incidentally, the switch circuits SW connect the external joint terminals OJOIN to the internal circuits only when a predetermined voltage level is applied to not-shown test pads, and in other cases, connect the external joint terminals OJOIN to the internal joint terminals IJOIN2.

Incidentally, the switch circuits SW may be formed in a chip whose relative size is larger (in this example, the logic chip LOG). In this case, for example, in the logic chip LOG, signals received at the external terminals ETL exposed to the outside of the memory chip MEM in a CoC state can be supplied selectively either to the internal circuits of the logic chip LOG or to the internal circuits of the memory chip MEM.

The sixth embodiment described above can also provide the same effects as those of the first and fifth embodiments previously described. In addition, since the external terminals BP of the semiconductor device SEM are connected to the internal circuits of the memory chip MEM or the logic chip LOG via the switch circuits SW, it is possible to conduct a more detailed test of the memory chip MEM with a less number of terminals.

Figure 11:
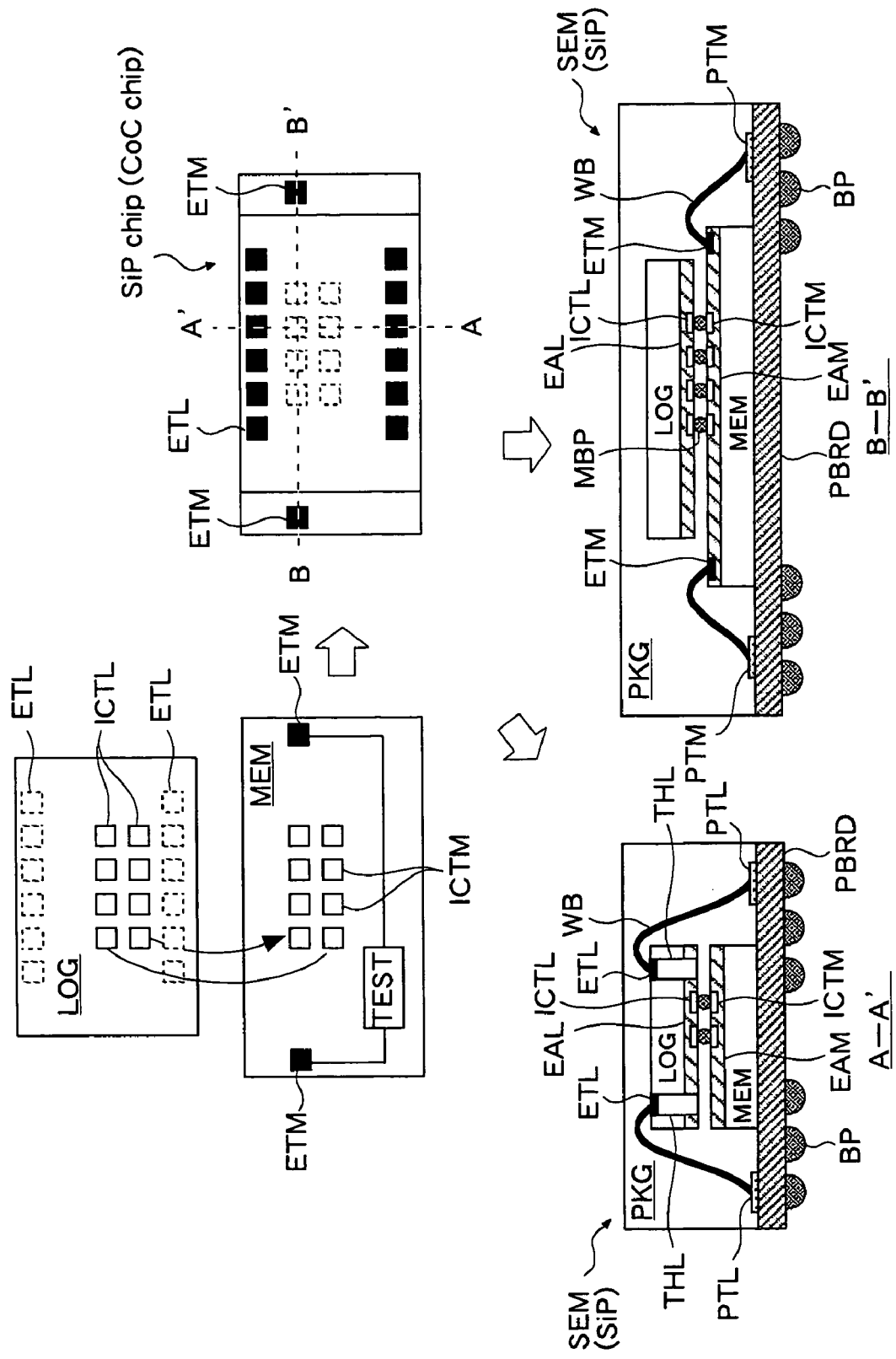
FIG. 11 is an explanatory view showing a seventh embodiment of the present invention.

FIG. 11 shows a seventh embodiment of the present invention. The same reference numerals and symbols are used to designate the same elements as the elements described in the first embodiment, and detailed description thereof will be omitted. In this embodiment, the structures of a memory chip MEM and a logic chip LOG are different from those of the first embodiment. The other structure is the same as that of the first embodiment.

In this embodiment, a length in the lateral direction in FIG. 11 of the memory chip MEM (first chip) is larger than that of the logic chip LOG (second chip), and the memory chip MEM has two external terminals ETM at positions (right and left directions in FIG. 11) not overlapping with the logic chip LOG. The logic chip LOG has a plurality of external terminals ETL at positions overlapping with the memory chip MEM. The external terminal terminals ETL include terminals of control signals and a power supply terminal. The external terminals ETL are connected to an element formed area EAL via through holes THL. A semiconductor device SEM of this embodiment has substantially the same structure as that of the first embodiment (FIG. 1) except in that the logic chip LOG with a smaller size is pasted on the memory chip MEM with a larger size.

The seventh embodiment described above can also provide the same effects as those of the first embodiment previously described. In addition, since the through holes THL are formed, it is possible to connect the external terminals ETL of the logic chip LOG directly to external terminals BP of the semiconductor device SEM even in a case where the logic chip LOG is smaller than the memory chip MEM. Especially because power supply can be supplied to the logic chip LOG not via the memory chip MEM, an operation margin of the logic chip LOG can be improved. Generally, the memory chip MEM has a small number of metal wiring layers, and therefore, adding power supply wirings for the logic chip LOG may possibly increase a power supply resistance and lower the operation margin.

Figure 12:
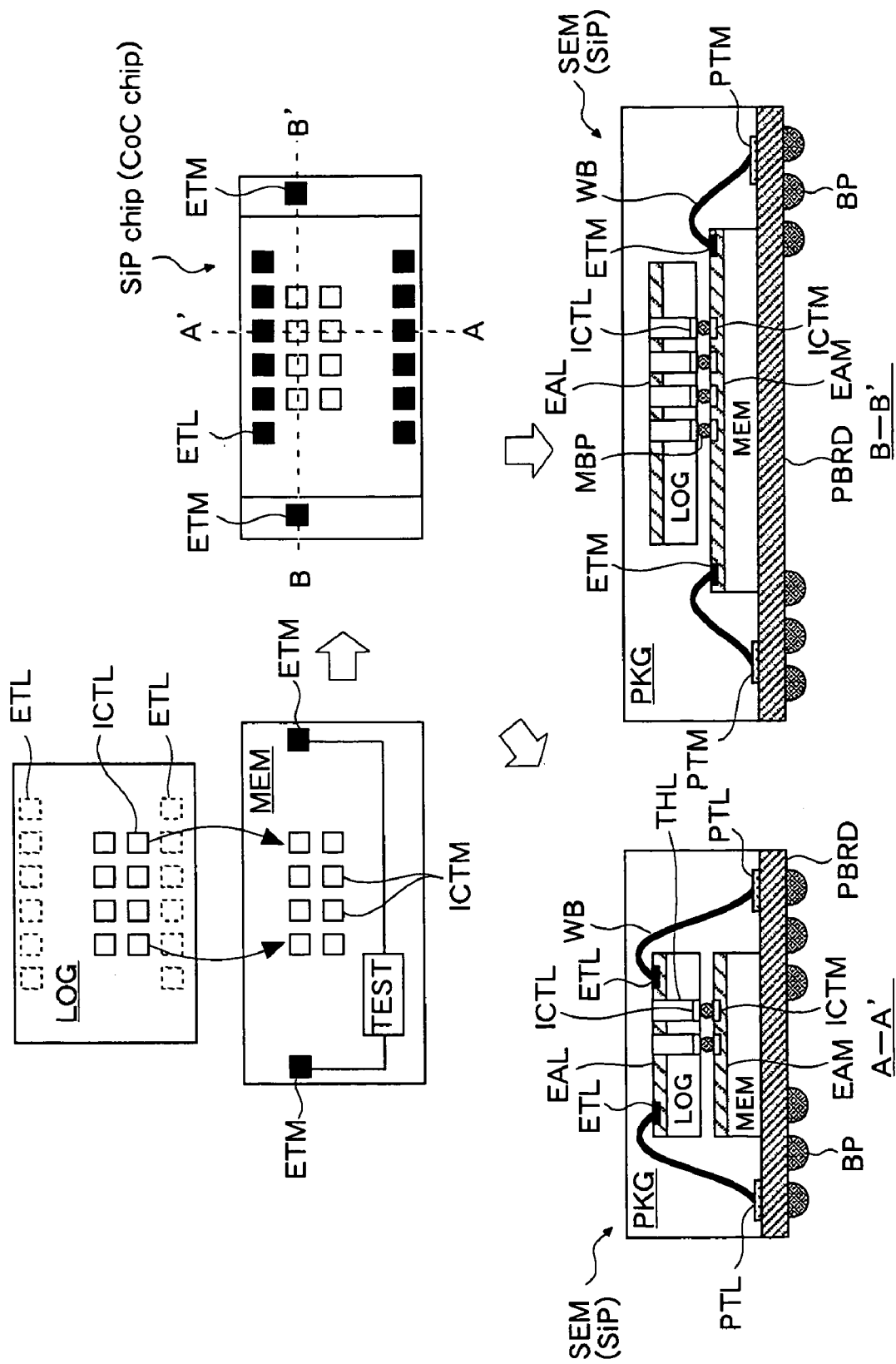
FIG. 12 is an explanatory view showing an eighth embodiment of the present invention.

FIG. 12 shows an eighth embodiment of the present invention. The same reference numerals and symbols are used to designate the same elements as the elements described in the first and fourth embodiments, and detailed description thereof will be omitted. A semiconductor device SEM of this embodiment has substantially the same structure as that of the fourth embodiment (FIG. 8) except in that a logic chip LOG with a smaller size is pasted on a memory chip MEM with a larger size.

The logic chip LOG (second chip) has a plurality of external terminals ETL at positions overlapping with the memory chip (first chip). The external terminals ETL include terminals of controls signals and a power supply terminal. The external terminals ETL are connected to an element formed area EAL via through holes THL. The eighth embodiment described above can also provide the same effects as those of the first, fourth, and seventh embodiments previously described.

Figure 13:
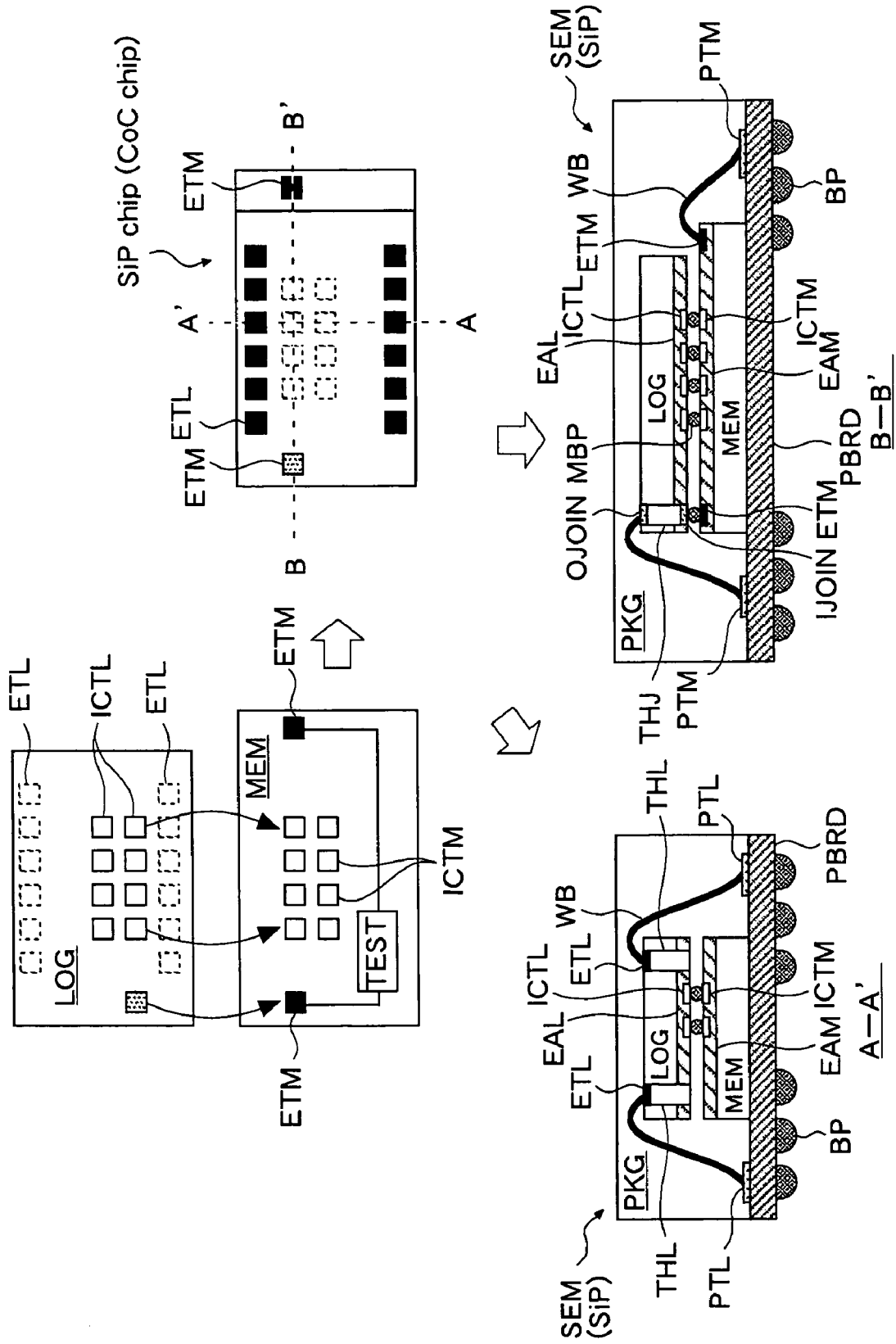
FIG. 13 is an explanatory view showing a ninth embodiment of the present invention.

FIG. 13 shows a ninth embodiment of the present invention. The same reference numerals and symbols are used to designate the same elements as the elements described in the first and fifth embodiments, and detailed description thereof will be omitted. A semiconductor device SEM of this embodiment has substantially the same structure as that of the fifth embodiment (FIG. 9) except in that a logic chip LOG (second chip) with a smaller size is pasted on a memory chip MEM (first chip) with a larger size. That is, in this embodiment, as shown in the B-B' cross section, one of external terminals ETM (left ETM in FIG. 13) of the memory chip MEM is connected to an exterior of the semiconductor device SEM via an internal joint terminal IJOIN, a through hole THJ, and an external joint terminal OJOIN formed in the logic chip LOG.

The ninth embodiment described above can also provide the same effects as those of the first, fifth, and seventh embodiments previously described.

Figure 14:
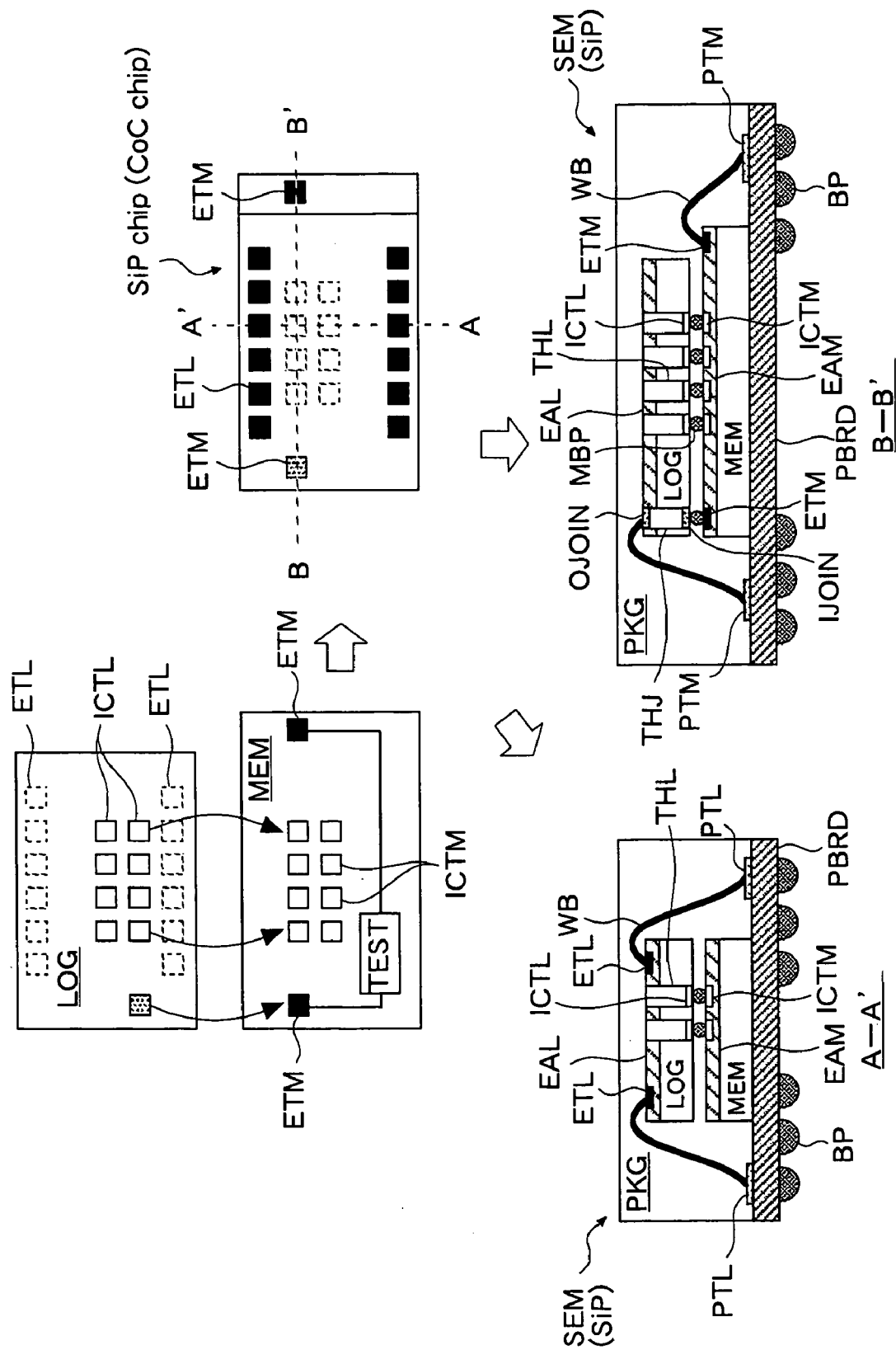
FIG. 14 is an explanatory view showing a tenth embodiment of the present invention.

FIG. 14 shows a tenth embodiment of the present invention. The same reference numerals and symbols are used to designate the same elements as the elements described in the first, fifth, eighth, and ninth embodiments, and detailed description thereof will be omitted. A length in a lateral direction of a memory chip MEM (first chip) of this embodiment is smaller than that of the memory chip MEM of the eighth embodiment (FIG. 13). Therefore, in a state where a SiP chip is assembled, one (left ETM in FIG. 14) of external terminals ETM of the memory chip MEM is covered with a logic chip LOG (second chip). As in the ninth embodiment (FIG. 13), the logic chip LOG has an internal joint terminal IJOIN, a through hole THJ, and an external joint terminal OJOIN in order to connect the external terminal ETM to an external terminal BP of a semiconductor device SEM. Further, as shown in the A-A' and B-B' cross sections, an element formed area EAL of the logic chip LOG is formed on a surface opposite a surface facing the memory chip MEM in a state where the SiP chip is assembled. Therefore, the logic chip LOG has through holes THL for connecting interconnection terminals ICTL to the element formed area EAL.

The tenth embodiment described above can also provide the same effects as those of the first, firth, and seventh embodiments previously described.

Figure 15:
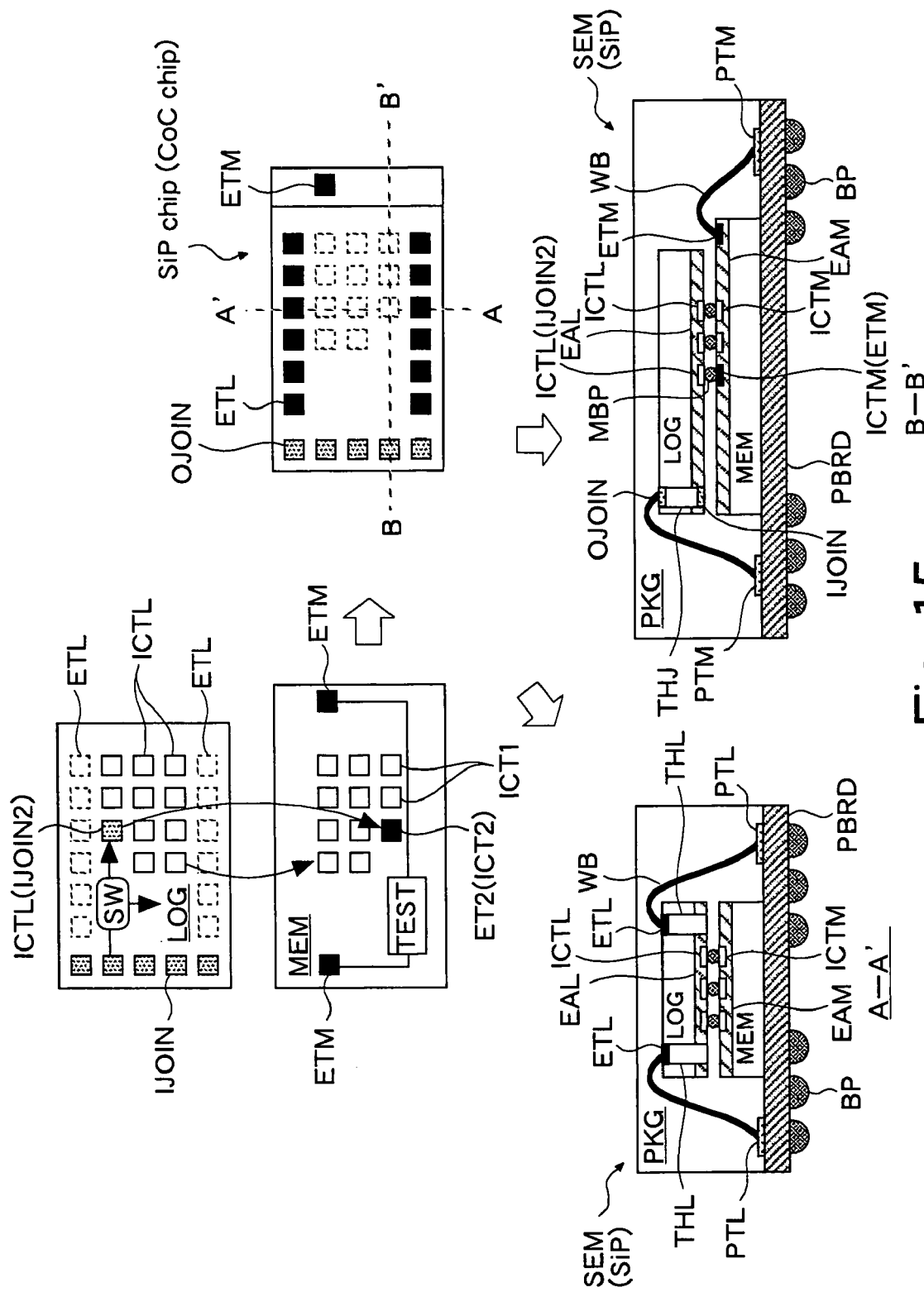
FIG. 15 is an explanatory view showing an eleventh embodiment of the present invention.

FIG. 15 shows an eleventh embodiment of the present invention. The same reference numerals and symbols are used to designate the same elements as the elements described in the first, sixth, seventh, and ninth embodiments, and detailed description thereof will be omitted. In this embodiment, the switch circuits SW of the sixth embodiment (FIG. 10) are formed in the logic chip LOG of the ninth embodiment (FIG. 13). Though not specifically shown, the switch circuits SW and internal joint terminals IJOIN2 are formed for respective internal joint terminals IJOIN.

The switch circuits SW connect external joint terminals OJOIN of the logic chip LOG (second chip) selectively either to internal circuits of the logic chip LOG or to external terminals ETM (ICTM) of a memory chip MEM (first chip). The internal joint terminals IJOIN2 connected to outputs of the switch circuits SW function as interconnection terminals ICTL which are connected to the interconnection terminals ICTM of the memory chip MEM via micro-bumps MBP, in order to connect the external joint terminals OJOIN to the external terminals ETM (ICTM). Further, the interconnection terminals ICTM connected to the internal joint terminals IJOIN2 function as the external terminals ETM connected to an exterior of a semiconductor device SEM.

Incidentally, the switch circuits SW may be formed on a chip whose relative size is larger (in this example, the memory chip MEM). In this case, for example, in the memory chip MEM, signals received at the external terminals ETM exposed to the outside of the memory chip MEM in a CoC state can be supplied selectively either to internal circuits of the memory chip MEM or to the internal circuits of the logic chip LOG.

The eleventh embodiment described above can also provide the same effects as those of the first, sixth, and seventh embodiments previously described.

Figure 16:
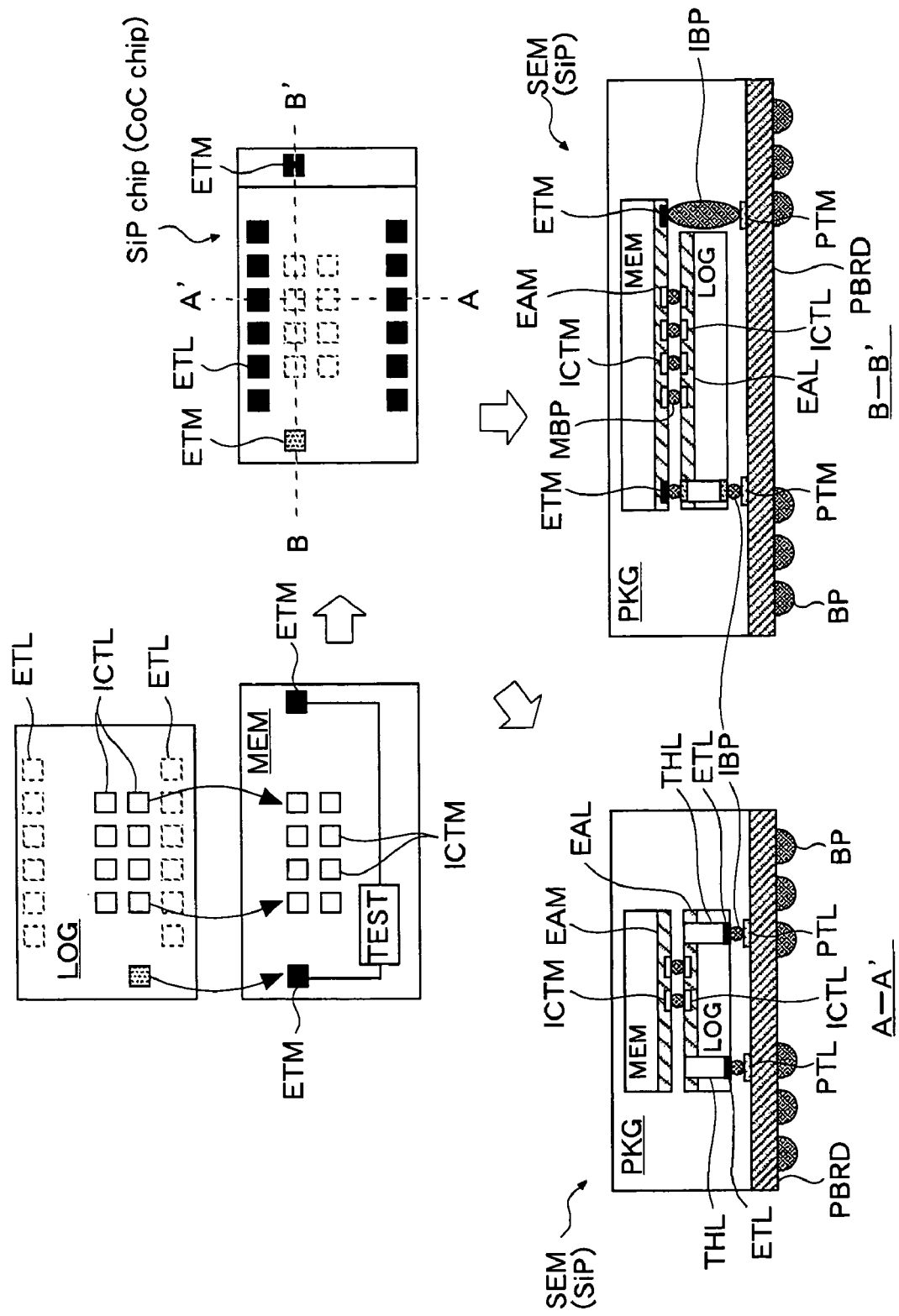
FIG. 16 is an explanatory view showing a twelfth embodiment of the present invention.

FIG. 16 shows a twelfth embodiment of the present invention. The same reference numerals and symbols are used to designate the same elements as the elements described in the first and ninth embodiments, and detailed description thereof will be omitted. In this embodiment, the SiP chip of the ninth embodiment (FIG. 13) is sealed in another package PKG. In this example, a logic chip LOG is disposed on a package board PBRD side contrary to FIG. 13, and bumps IBP are formed on external terminals ETL, ETM. The external terminals ETL, ETM are connected to terminals PTL, PTM of the package board PBRD via the bumps IBP. The twelfth embodiment described above can also provide the same effects as those of the first and ninth embodiments previously described.

Figure 17:
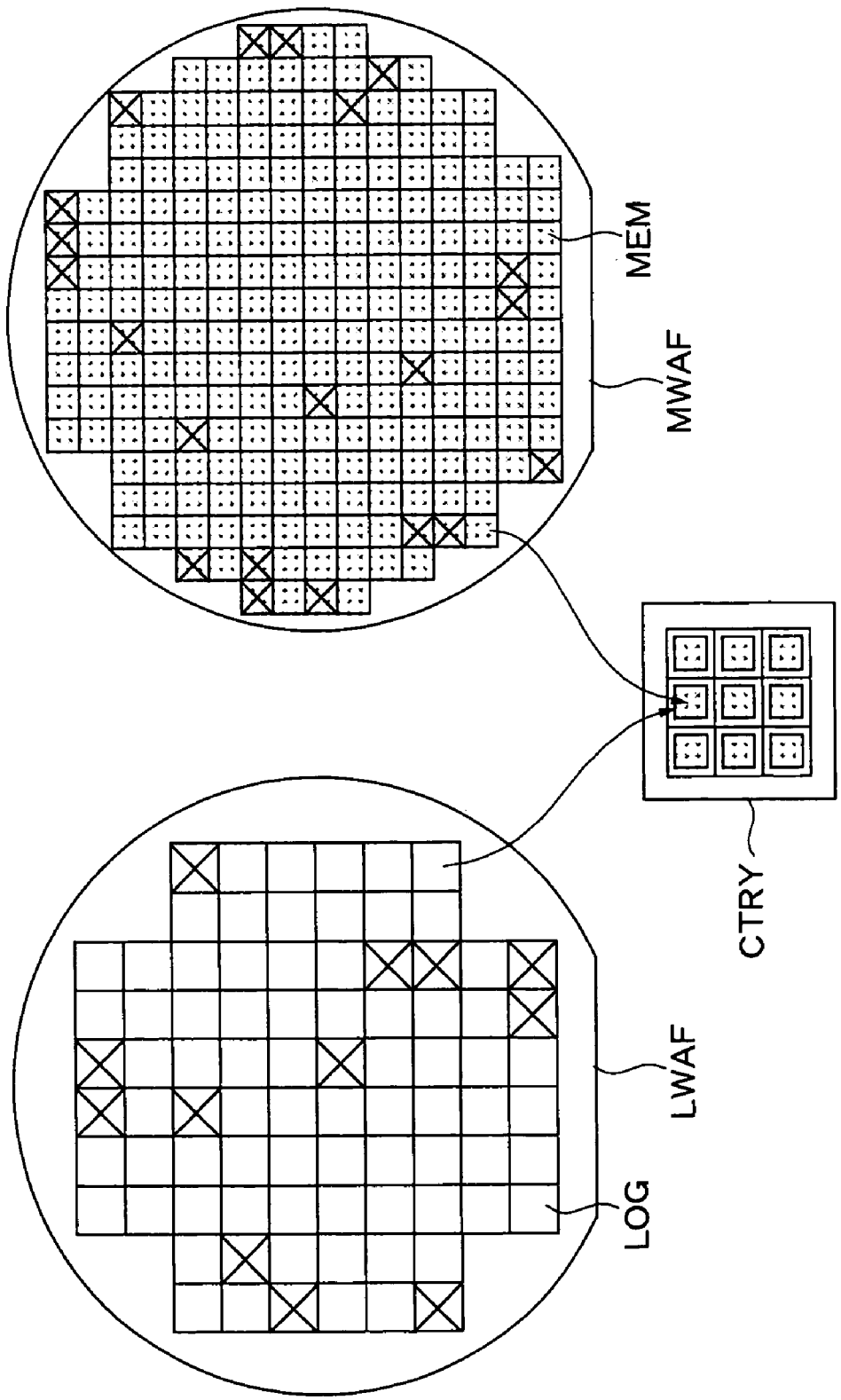
FIG. 17 is an explanatory view showing a thirteenth embodiment of the present invention.

FIG. 17 shows a thirteenth embodiment of the present invention. The same reference numerals and symbols are used to designate the same elements as the elements described in the first and ninth embodiments, and detailed description thereof will be omitted. In this embodiment, logic chips LOG (first chips) are put on a chip tray CTRY, and thereafter, memory chips MEM (second chips) are pasted on the logic chips LOG on the chip tray CTRY. The logic chips LOG and the memory chips MEM put on the chip tray CTRY are good chips which normally operate. In FIG. 17, chips marked with X in a logic wafer LWAF and a memory wafer MWAF are bad chips, and chips having no mark are good chips. In this embodiment, for example, the logic chip LOG and the memory chip MEM of the first embodiment are used.

Figure 18:
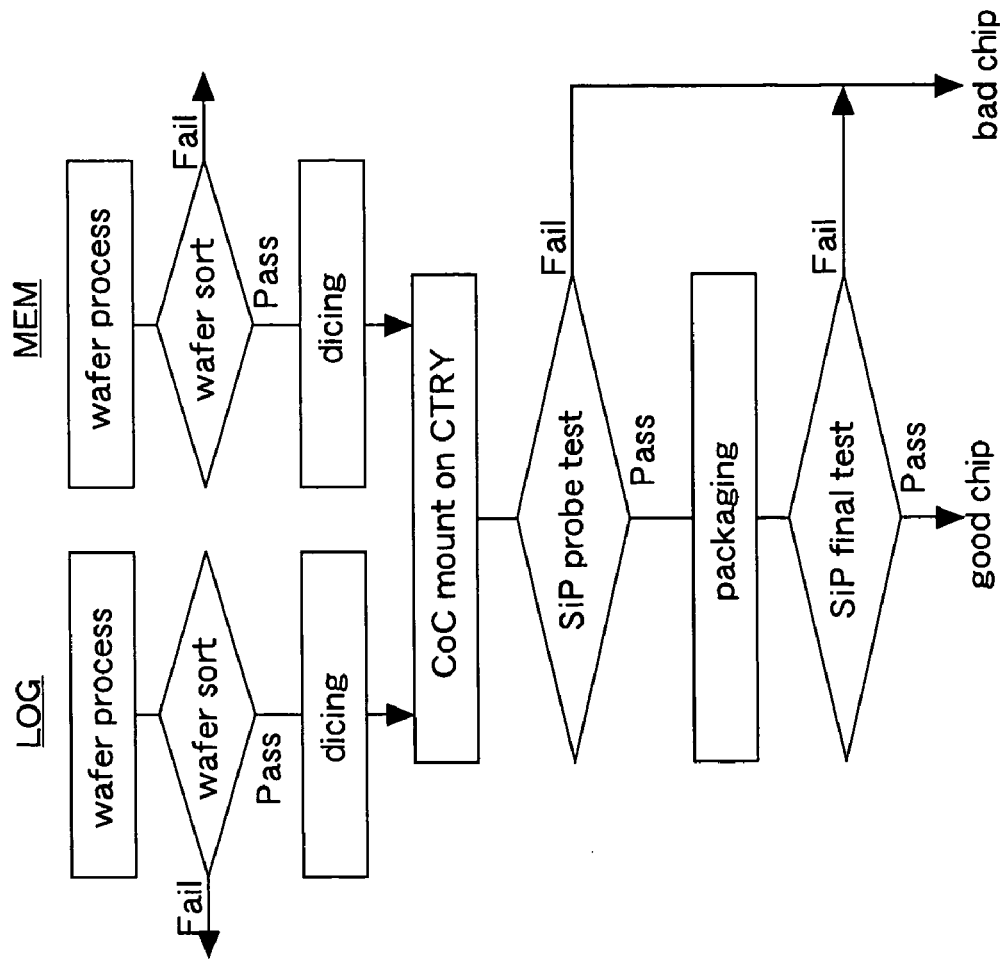
FIG. 18 is a flowchart showing a manufacturing method of a semiconductor device in the thirteenth embodiment of the present invention.

FIG. 18 shows a manufacturing method of a semiconductor device SEM of the thirteenth embodiment. Detailed description of the same steps as those in FIG. 3, FIG. 5, and FIG. 6 described above will be omitted. In this embodiment, logic chips LOG and memory chips MEM having undergone a wafer process are subjected to a probe test in a wafer sort step and are sorted into good chips and bad chips.

After the wafer sort step, the wafers are diced into individual logic chips LOG and individual memory chips MEM. Thereafter, the memory chips MEM are mounted on the logic chips LOG on the chip tray CTRY (CoC mount). Next, a plurality of SiP chips put on the chip tray CTRY are subjected to a probe test simultaneously to be sorted into good chips and bad chips. Only SiP chips determined as the good chips by the probe test are packaged, whereby SiPs (semiconductor devices SEM) are completed. Then, the SiPs are subjected to a final test to be sorted into good chips and bad chips.

The thirteenth embodiment described above can also provide the same effects as those of the first and third embodiment previously described. In addition, since the chip tray CTRY is used for the probe test of the SiP chips, it is possible to simultaneously test the plural SiP chips which are manufactured by using only the good logic chips LOG and memory chips MEM. The time for the probe test of the SiP chips can be shortened and manufacturing cost can be reduced.

Figure 19:
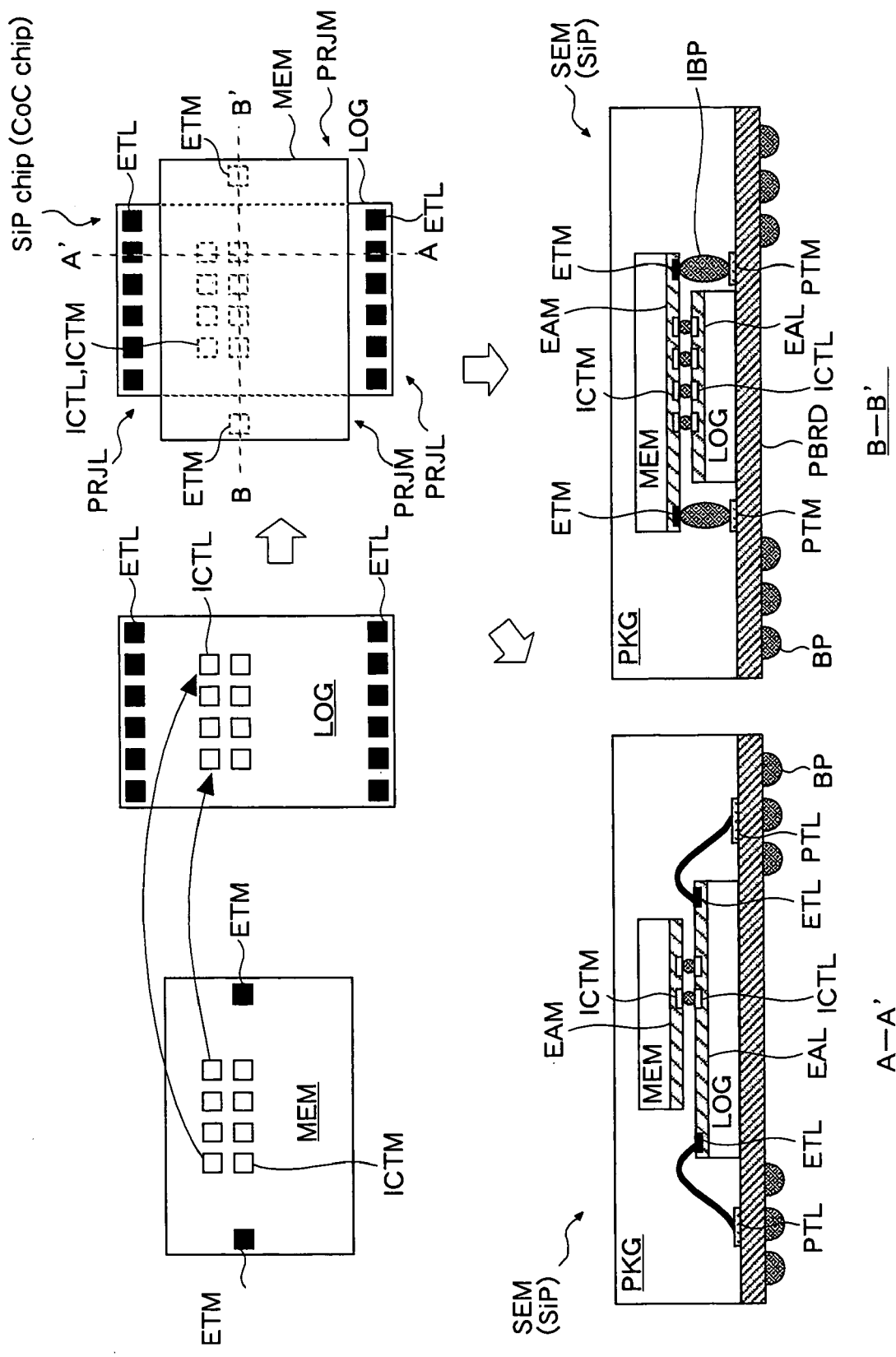
FIG. 19 is an explanatory view showing a fourteenth embodiment of the present invention.

FIG. 19 shows a fourteenth embodiment of the present invention. The same reference numerals and symbols are used to designate the same elements as the elements described in the first embodiment, and detailed description thereof will be omitted. In this embodiment, in a state where a SiP chip is assembled, a logic chip LOG has projection parts PRJL which are parts of an outer periphery thereof projecting from an outer periphery of a memory chip MEM. The memory chip MEM has projection parts PRJM which are parts of the outer periphery thereof projecting from the outer periphery of the logic chip LOG. External terminals ETL of the logic chip LOG are formed in the projection parts PRJL. External terminals ETM of the memory chip MEM are formed in the projection parts PRJM. The external terminals ETL, ETM include power supply terminals and are electrically connected to external terminals BP of a semiconductor device SEM. Further, the external terminals ETL, ETM are formed in element formed areas EAL, EAM respectively. The memory chip MEM has a test circuit (not shown) connected to the external terminals ETM as in the first embodiment. The logic chip LOG and the memory chip MEM are electrically connected to each other via interconnection terminals ICTL, ICTM.

The element formed area EAL of the logic chip LOG and the element formed area EAM of the memory chip MEM face each other in a state where the logic chip LOG and the memory chip MEM are assembled into the SiP chip as shown in the A-A' and B-B' cross sections. The external terminals ETL of the logic chip LOG are bonded to terminals PTL of a package PKG via metal wires WB or the like. The external terminals ETM of the memory chip MEM are connected to terminals PTM of a package board PBRD via bumps IBP. Since the external terminals ETL, ETM are formed in the projection parts PRJL, PRJM respectively, it is possible to easily connect the external terminals ETL, ETM to the terminals PTL, PTM of the package PKG when the SiP chip is sealed in the package PKG.

The fourteenth embodiment described above can also provide the same effects as those of the first embodiment previously described. In addition, since the external terminals ETL, ETM can be connected to the terminals PTL, PTM of the package PKG, it is possible to independently test the logic chip LOG and the memory chip MEM. Further, since independent power supplies can be supplied to the logic chip LOG and the memory chip MEM respectively, operation margins thereof can be improved. Since the external terminals ETL, ETM can be easily connected to the terminals PTL, PTM of the package PKG, it is possible to easily develop the package PKG, which can reduce development cost.

Figure 20:
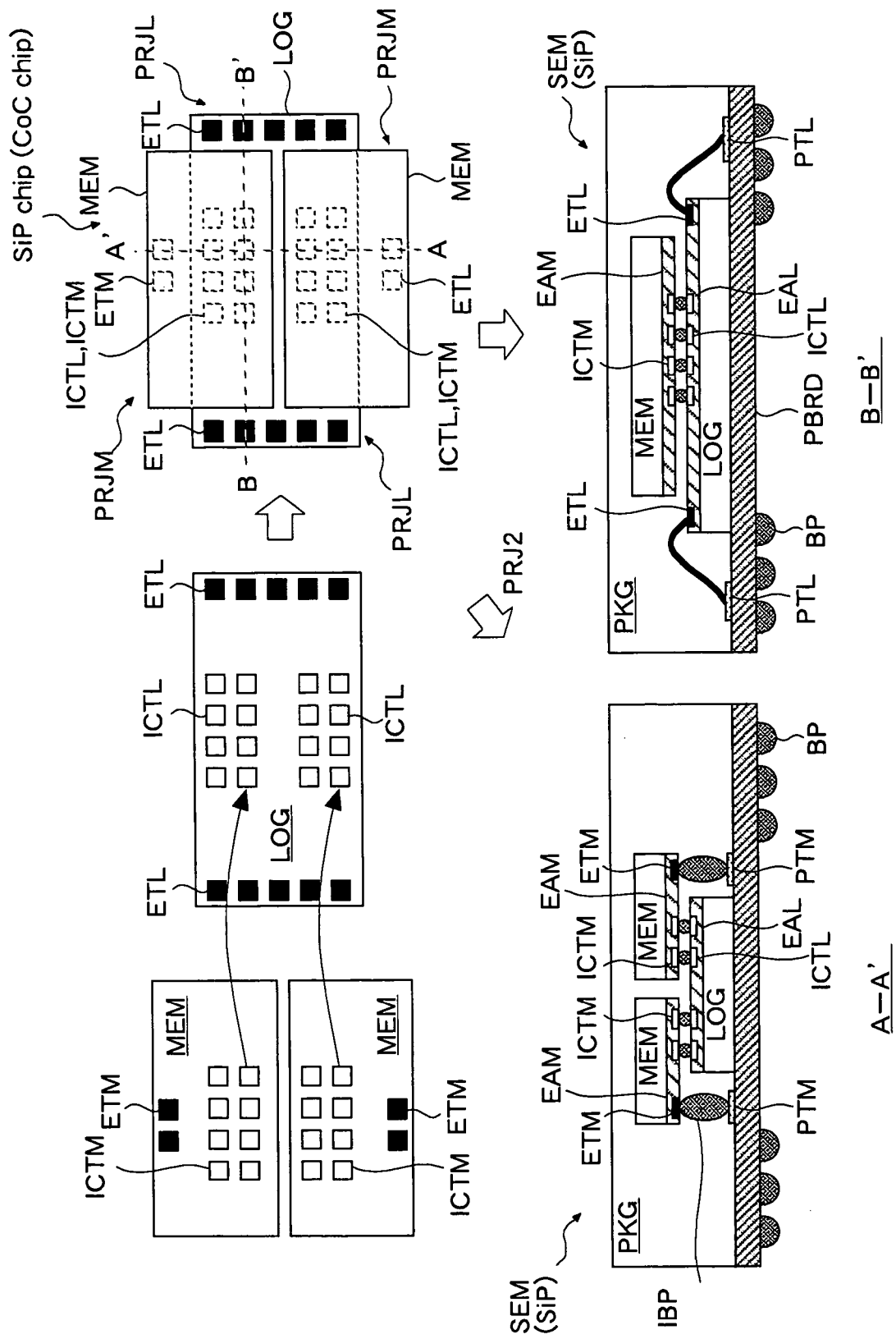
FIG. 20 is an explanatory view showing a fifteenth embodiment of the present invention.

FIG. 20 shows a fifteenth embodiment of the present invention. The same reference numerals and symbols are used to designate the same elements as the elements described in the first and fourteenth embodiments, and detailed description thereof will be omitted. This embodiment is different from the fourteenth embodiment in that a plurality of memory chips MEM are pasted on a logic chip LOG. The other structure is the same as that of the fourteenth embodiment (FIG. 19). Specifically, external terminals ETL, ETM include power supply terminals. Each of the memory chips MEM has a test circuit (not shown) connected to the external terminals ETM. The eleventh embodiment described above can also provide the same effects as those of the first and fourteenth embodiments previously described.

Figure 21:
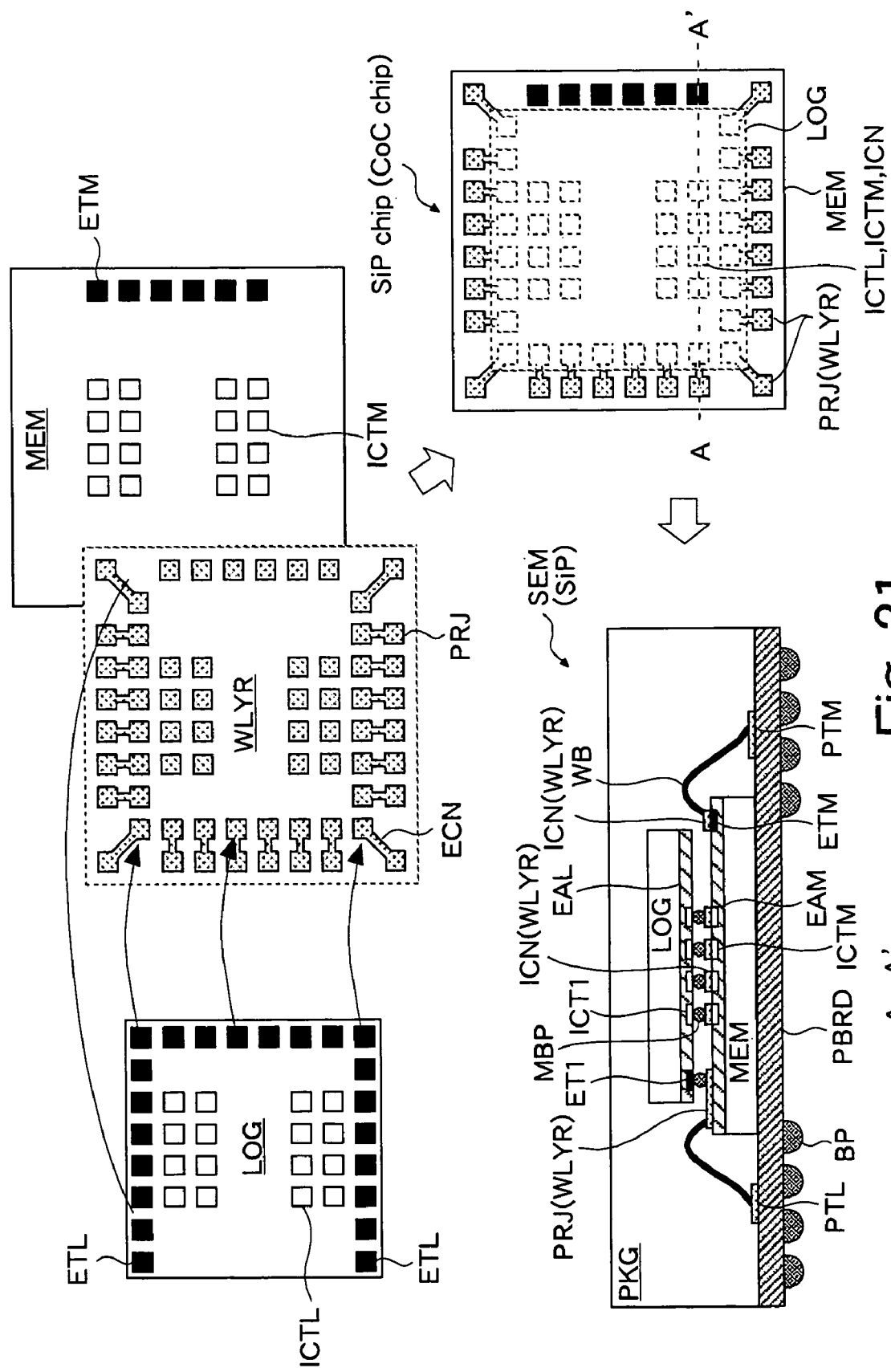
FIG. 21 is an explanatory view showing a sixteenth embodiment of the present invention.

FIG. 21 shows a sixteenth embodiment of the present invention. The same reference numerals and symbols are used to designate the same elements as the elements described in the first embodiment, and detailed description thereof will be omitted. In this embodiment, a logic chip LOG (second chip) with a smaller chip size is pasted on a memory chip MEM (first chip) with a larger chip size to form a SiP chip.

The logic chip LOG has a plurality of external terminals ETL and interconnection terminals ICTL formed in an element formed area EAL. The external terminals ETL include a power supply terminal. The memory chip MEM has a plurality of external terminals ETM and interconnection terminals ICTM formed in an element formed area EAM. The external terminals ETM include a power supply terminal. The external terminals ETM may include a start terminal (test terminal) of a not-shown BIST circuit formed in the memory chip MEM, and may include a test command terminal, a test address terminal, and a test data terminal through which the memory chip MEM is independently tested. Owing to the external terminals ETL, ETM, it is possible to independently test the logic chip LOG and the memory chip MEM. Further, in this embodiment, a wiring layer WLYR is formed on the memory chip MEM. The wiring layer WLYR has interconnection parts ICN and external connection parts ECN.

The interconnection parts ICN are formed on the interconnection terminals ICTM and the external terminals ETM of the memory chip MEM. The external connection parts ECN are formed on a not-shown insulation film of the memory chip MEM and are electrically insulated from the element formed area EAM. In the external connection parts ECN, portions covered with the logic chip LOG are connected to the external terminals ETL of the logic chip LOG via micro-bumps MBP. In the external connection parts ECN, projection parts PRJ projecting to the outside of the logic chip LOG are connected to external terminals PTL of a package PKG.

Owing to the external connection parts ECN, an effect equivalent to that in a case where the external terminals ETL of the logic chip LOG are moved to the outside of the logic chip LOG can be obtained. Therefore, the external terminals ETL of the logic chip LOG are connectable to the terminals PTL without being electrically connected to the memory chip MEM, even though being covered with the memory chip MEM. With this structure, it is possible to make the external terminals ETL (ECN), ETM of the logic chip LOG and the memory chip MEM assembled into the SiP chip face the same side (upper side in the A-A' cross section). Therefore, it is possible to simultaneously test the logic chip LOG and the memory chip MEM by bringing test probes into contact with the logic chip LOG and the memory chip MEM from the same side. Further, since thee is no intervention of the memory chip MEM, it is possible to lower a power supply resistance (resistance of a power supply wiring) of the logic chip LOG and to improve an operation margin of the logic chip LOG.

Figure 22:
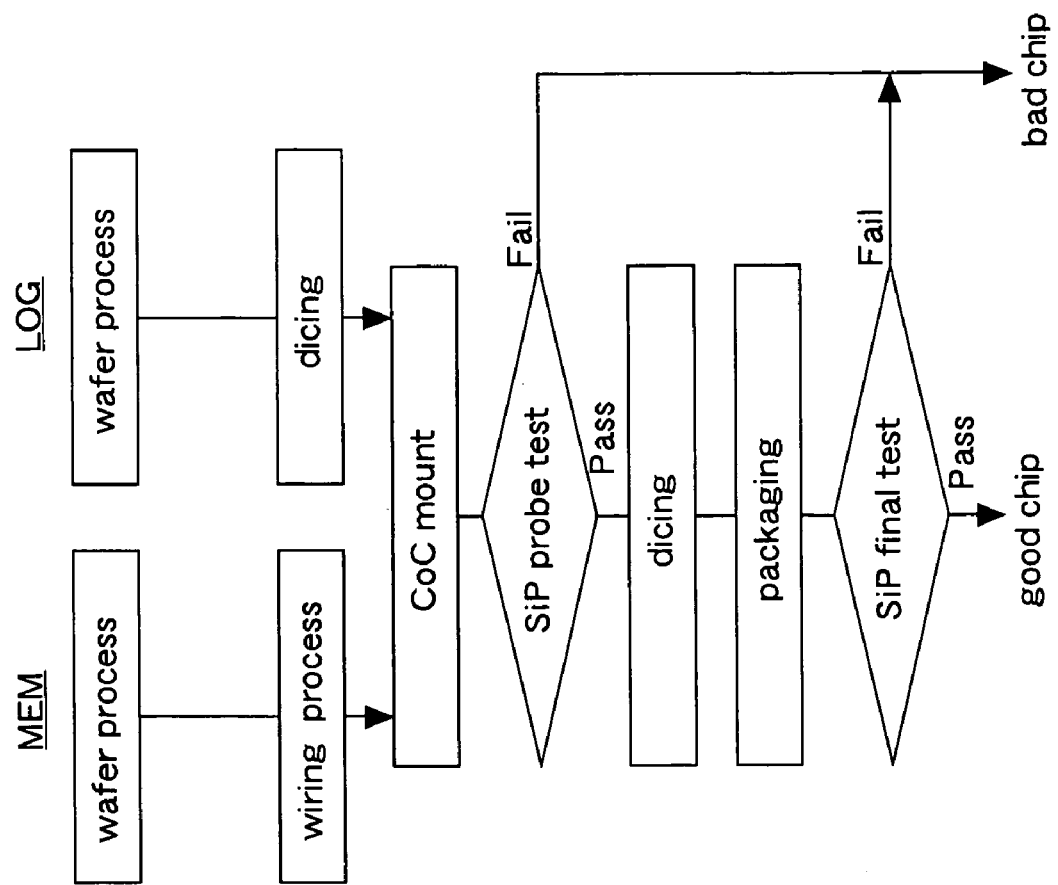
FIG. 22 is a flowchart showing a manufacturing method of a semiconductor device in the sixteenth embodiment of the present invention.

FIG. 22 shows a manufacturing method of the semiconductor device SEM of the sixteenth embodiment. Detailed description of the same steps as those in FIG. 3 described above will be omitted. In this embodiment, memory chips MEM having undergone a wafer process are subjected to a wiring process for forming the wiring layers WLYR. Then, logic chips LOG which are diced apart are pasted on the memory chips MEM in a wafer state, whereby a plurality of SiP chips are formed (CoC mount). Subsequent steps are the same as those in FIG. 3. Specifically, the SiP chips in a wafer state are sorted into good chips and bad chips by conducting a probe test. At this time, by simultaneously testing the logic chips LOG and the memory chips MEM by using the external terminals ETL (ECN), ETM, it is possible to shorten the test time.

The sixteenth embodiment described above can also provide the same effects as those of the first embodiment previously described. In addition, even after the logic chip LOG with a smaller chip size is pasted on the memory chip MEM with a larger chips size, it is possible to test the memory chip MEM and the logic chip LOG while independently operating the memory chip MEM and the logic chip LOG by using the external terminals ETM and the external terminals ETL connected to the external connection parts ECN. Further, since test probes or the like can be brought into contact with the external terminals ETM and the external connection parts ECN from the same side, it is possible to simultaneously test the memory chip MEM and the logic chip LOG. Further, by using the external terminals ETM, ETL, it is possible to supply independent power supplies to the memory chip MEM and the logic chip LOG respectively. As a result, it is possible to improve operation margins of the memory chip MEM and the logic chip LOG.

Figure 23:
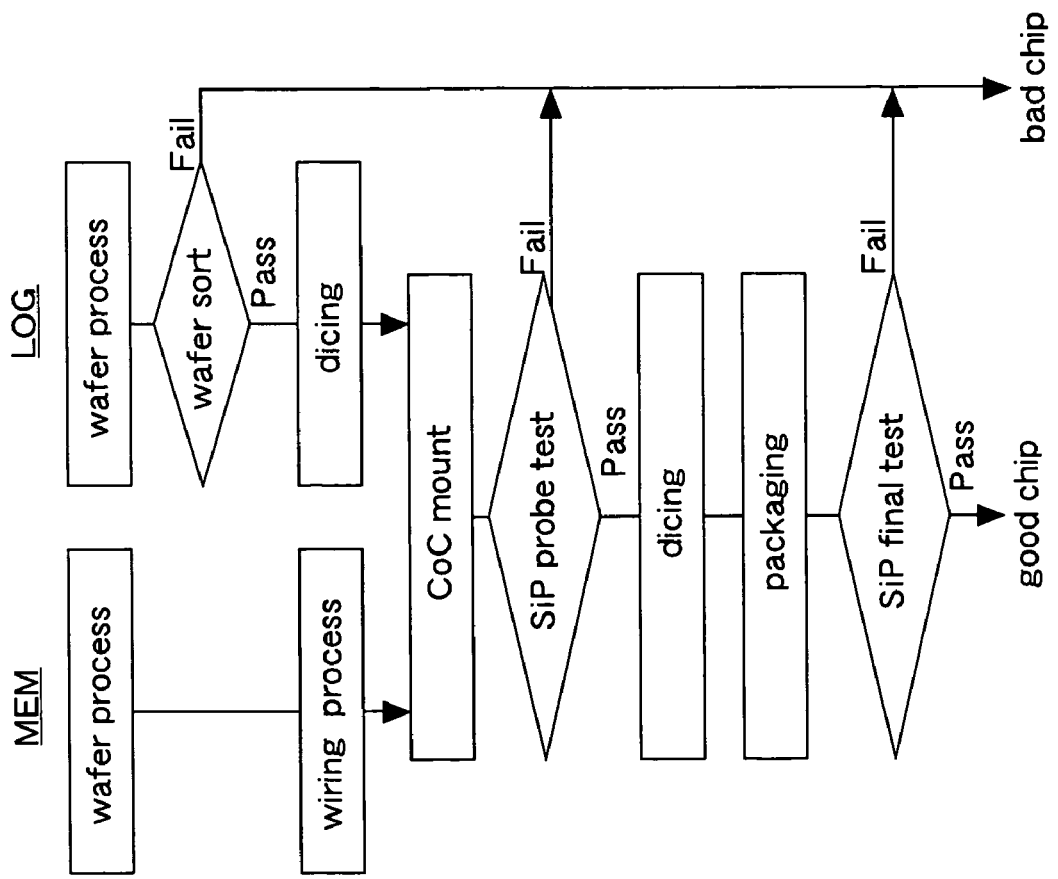
FIG. 23 is a flowchart showing a manufacturing method of a semiconductor device in a seventeenth embodiment of the present invention.

FIG. 23 shows a manufacturing method of a semiconductor device in a seventeenth embodiment of the present invention. The same reference numerals and symbols are used to designate the same elements as the elements described in the first and sixteenth embodiments, and detailed description thereof will be omitted. In this embodiment, before logic chips LOG are diced apart, a wafer sort step is inserted. The other steps are the same as those of the sixteenth embodiment. Further, the manufactured semiconductor device is the same as that in FIG. 21. The seventeenth embodiment described above can also provide the same effects as those of the first, second, and sixteenth embodiments previously described.

Figure 24:
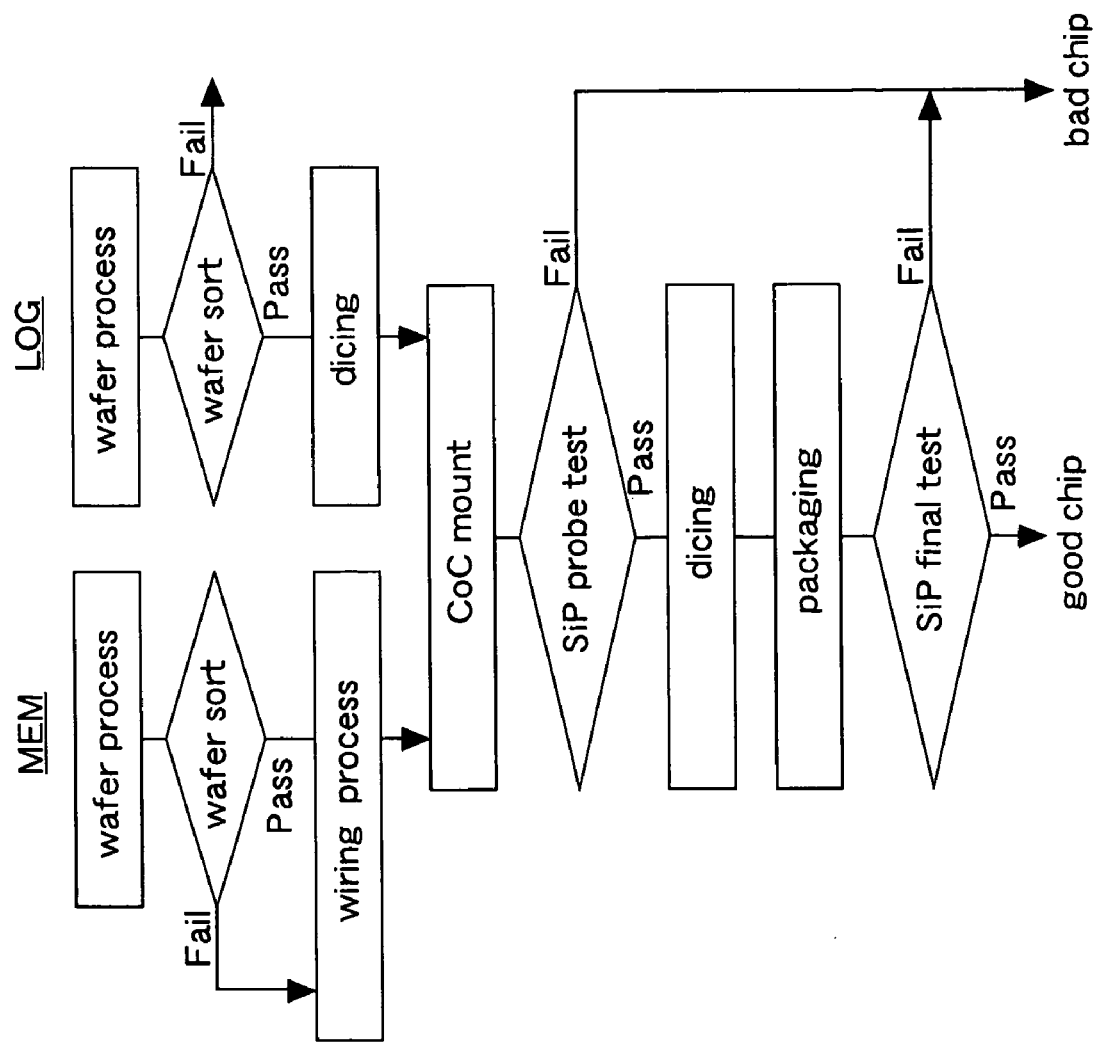
FIG. 24 is a flowchart showing a manufacturing method of a semiconductor device in an eighteenth embodiment of the present invention.

FIG. 24 shows a manufacturing method of a semiconductor device in an eighteenth embodiment of the present invention. The same reference numerals and symbols are used to designate the same elements as the elements described in the first and sixteenth embodiments, and detailed description thereof will be omitted. In this embodiment, before logic chips LOG (second chips) are diced apart, a wafer sort step is inserted, and after a wafer process of memory chips MEM (first chips), a wafer sort step is inserted. The other steps are the same as those of the sixteenth embodiment. In this embodiment, memory chips MEM determined as bad chips in the wafer sort step are also subjected to a wiring process. However, the logic chips LOG are pasted only on memory chips MEM which normally operate. The manufactured semiconductor device is the same as that in FIG. 21. The eighteenth embodiment described above can also provide the same effects as those of the first, second, and sixteenth embodiments previously described.

Figure 25:
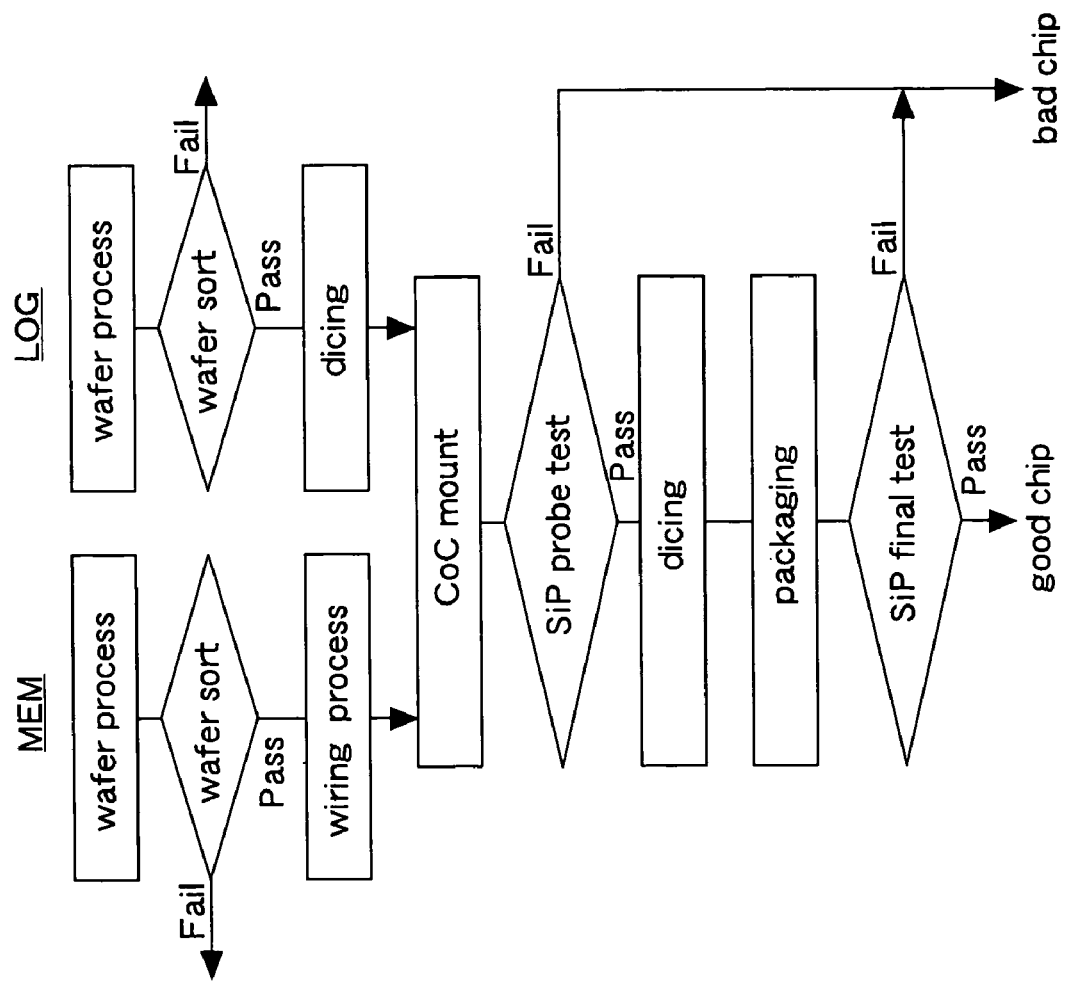
FIG. 25 is a flowchart showing a manufacturing method of a semiconductor device in a nineteenth embodiment of the present invention.

FIG. 25 shows a manufacturing method of a semiconductor device in a nineteenth embodiment of the present invention. The same reference numerals and symbols are used to designate the same elements as the elements described in the first, sixteenth, and eighteenth embodiments, and detailed description thereof will be omitted. In this embodiment, only memory chips MEM determined as good chips in a wafer sort step are subjected to a wiring process. The other steps are the same as those of the eighteenth embodiment (FIG. 24). The manufactured semiconductor device is the same as that in FIG. 21.

Figure 26:
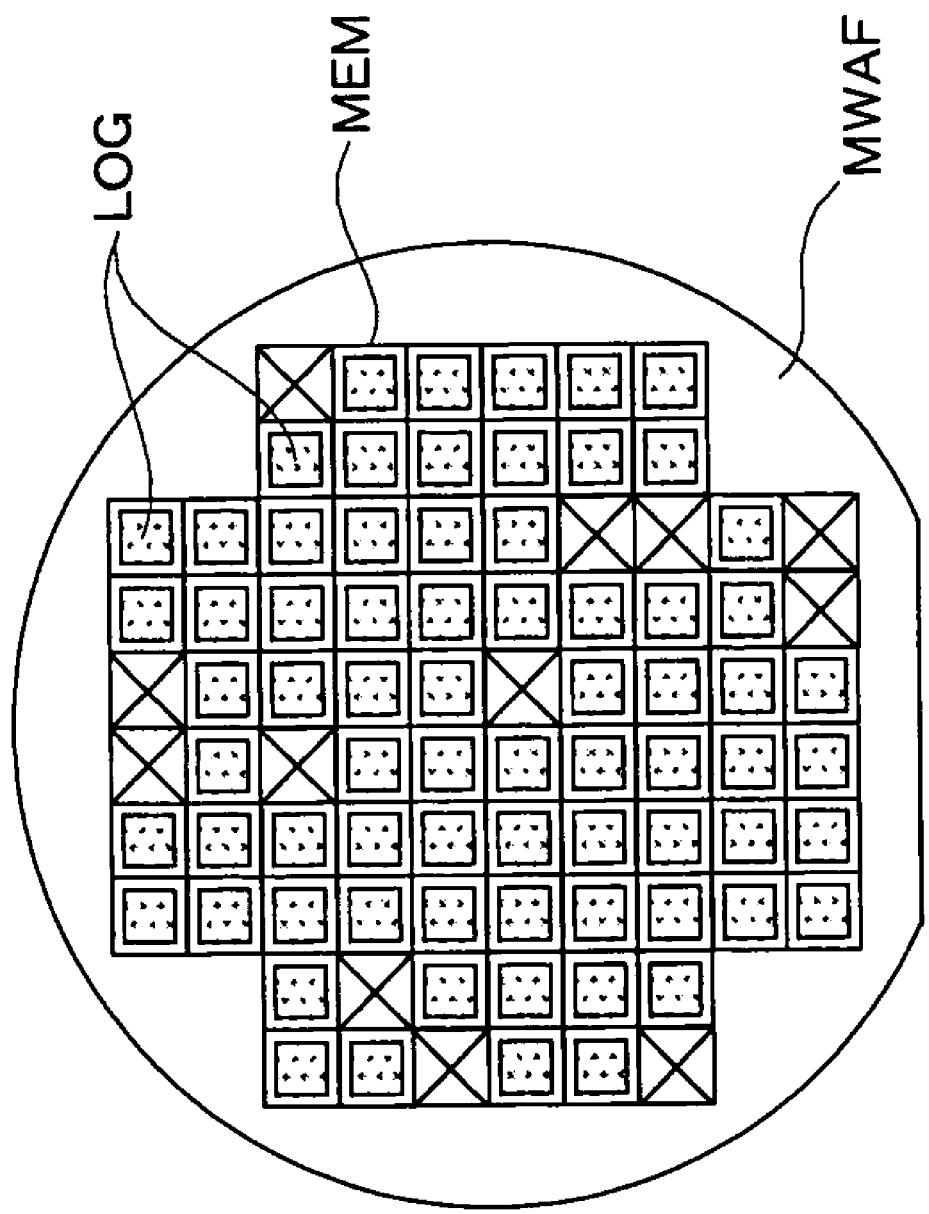
FIG. 26 is a plane view showing a wafer of memory chips after CoC mount shown in FIG. 25.

FIG. 26 shows a wafer MWAF of the memory chips MEM after the CoC mount shown in FIG. 25. The hatched chips in FIG. 26 are logic chips LOG mounted on the memory chips MEM. In this embodiment, a wiring layer WLYR is formed only on memory chips MEM which normally operate. A photomask (reticle) used to form the wiring layer WLYR corresponds to the size of each of the memory chips MEM. Therefore, in a photolithography step of the wiring layer WLYR, exposure is executed in a unit of the memory chip MEM. The wiring layer WLYR is not formed on bad memory chips MEM (marked with X in FIG. 26), and the logic chips LOG are not mounted thereon. A probe test of SiP chips is conducted on each of SiP chips separately. However, a probe test corresponding to the bad memory chips MEM is not conducted.

The ninth embodiment described above can also provide the same effects as those of the first, third, and sixteenth embodiments previously described. In addition, since no wiring layer WLYR is formed on the bad memory chips MEM, the time taken for the wiring process can be shortened and manufacturing cost of the semiconductor device SEM can be reduced.

The above first-sixth embodiments have described the examples where the test circuit TEST is formed on the memory chip MEM, and the external terminals ETM of the memory chip MEM are used as the test terminals. However, the present invention is not limited to such embodiments. The external terminals ETM are not limited to the test terminals but may be a power supply terminal and signal terminals. An example of another possible structure is to form a larger number of the external terminals ETM and use part of the external terminals ETM as the power supply terminal. In this case, by using the external terminals ETL, ETM, it is possible to supply independent power supplies to the logic chip LOG and the memory chip MEM respectively. As a result, operation margins of the logic chip LOG and the memory chip MEM can be improved. Further, as the external terminals ETM of the memory chip MEM, a command terminal, an address terminal, a data terminal, a power supply terminal, and the like may be formed besides the interconnection terminals ICTM. In this case, since the external terminals ETM function as a test command terminal, a test address terminal, and a test data terminal for the test, the test circuit TEST is not required. Further, these test command terminal, test address terminal, and test data terminal may be connected to the interconnection terminals ICTM (the command terminal, the address terminal, and the data terminal) connected to the logic chip LOG via through holes. In this case, it is possible to directly test the memory chip MEM without using the test circuit TEST while the power supply of the logic chip LOG is turned off.

The above sixth and eleventh embodiments (FIG. 10 and FIG. 15) have described the examples where the switch circuits SW are formed on the logic chip LOG or the memory chip MEM whose element formed areas EAL, EAM face each other in a state where the SiP chip is assembled. The present invention is not limited to such embodiments. For example, the switch circuits SW may be formed on the logic chip LOG or the memory chip MEM whose element formed areas EAL, EAM face the same side in a state where the SiP chip is assembled.

The above sixteenth embodiment has described the example where the wiring layer WLYR is formed on the memory chip MEM with a larger chip size and the logic chip LOG with a smaller chip size is pasted thereon via the wiring layer WLYR. The present invention is not limited to such an embodiment. Another possible example of the structure is to form the wiring layer WLYR on the logic chip LOG (first chip) with a larger chip size and paste the memory chip MEM (second chip) with a smaller chip size thereon via the wiring layer WLYR. The external terminals ETM are connected to the external terminals BP of the semiconductor device SEM via the projection parts PRJ of the wiring layer WLYR without being electrically connected to the logic chip LOG.

In this case, for example, the memory chip MEM has the test circuit TEST (BIST circuit). As in the first embodiment, the external terminals ETM of the memory chip MEM are test terminals through which the test circuit TEST is activated or the kind of test to be conducted is selected. During the normal operation mode, the memory chip MEM operates according to signals supplied from the logic chip LOG via the interconnection terminals ICTL, ICTM. During the test mode, the memory chip MEM operates under the control of the test circuit TEST.

Alternatively, by forming a test command terminal, a test address terminal, and a test data terminal as the external terminals ETM, it is possible to test the memory chip MEM in detail independently from the test of the logic chip LOG.

The invention is not limited to the above embodiments and various modifications may be made without departing from the spirit and scope of the invention. Any improvement may be made in part or all of the components.

What is claimed is:

1. A semiconductor device comprising:
   a first chip which has a first element formed area, a first interconnection terminal connected to a circuit formed in said first element formed area, and a first external terminal connecting the circuit formed in said first element formed area to an exterior of the semiconductor device;
   a second chip which has a second element formed area, a second interconnection terminal connected to a circuit formed in said second element formed area, and a second external terminal connecting the circuit formed in said second element formed area to the exterior of the semiconductor device, and which is disposed to face said first chip via said second interconnection terminal connected to said first interconnection terminal,
   wherein said first and second external terminals are formed on surfaces of said first and second chips, the surfaces being on a same side of said first and second chips,
   wherein said first external terminal is formed on the surface facing said second chip and is connected to said second chip via a conductive connection member,
   wherein said second chip includes an internal joint terminal formed on the surface facing said first chip and connected to said conductive connection member, an external joint terminal formed on a surface opposite to the surface facing said first chip, and a first through hole electrically connecting said internal joint terminal and said external joint terminal, and
   wherein said first external terminal is connected to an outside of the semiconductor device via said external joint terminal.

2. The semiconductor device according to claim 1, wherein: said first and second element formed areas are formed on surfaces of said first and second chips, the surfaces facing each other;
   said second external terminal is formed on a surface opposite to the surface of said second chip facing said first chip; and
   said second chip includes a second through hole penetrating from said second element formed area to said second external terminal.

3. The semiconductor device according to claim 1, wherein said second element formed area includes a switch circuit connecting said first through hole selectively either to an internal circuit of said second chip or to said internal joint terminal.

4. The semiconductor device according to claim 1, wherein: said first element formed area is formed on a surface facing said second chip; and
   said second element formed area is formed on the surface opposite to the surface facing said first chip;
   said second interconnection terminal is formed on the surface facing said first chip; and
   said second chip includes a second through hole penetrating from said second element formed area to said second interconnection terminal.

5. The semiconductor device according to claim 1, wherein one of said first and second chips includes a test circuit prohibited from operating during a normal operation mode and operating during a test mode to test an internal circuit, operates in response to a signal supplied to said first and second interconnection terminals during the normal operation mode, and operates in response to a test signal supplied to an own external terminal during the test mode.

6. The semiconductor device according to claim 1, wherein said first and second chips have different functions from each other.

7. A semiconductor device comprising:
   a first chip and a second chip electrically connected to each other and disposed to face each other,
   wherein the first chip when pasted on the second chip has a first projection part which is part of an outer periphery of the first chip projecting from an outer periphery of the second chip,
   the first projection part has a first external terminal electrically connected to an exterior of the semiconductor device,
   wherein another first external terminal is formed on the surface facing said second chip and is connected to said second chip via a conductive connection wherein,
   wherein said second chip includes an internal joint terminal formed on the surface facing said first chip and connected to said conductive connection member, an external joint terminal formed on a surface opposite to the surface facing said first chip, and a first through hole electrically connecting said internal joint terminal and said external joint terminal, and
   wherein said first external terminal is connected to an outside of the semiconductor device via said external joint terminal.

8. The semiconductor device according to claim 7, wherein: the first and second chips include first and second element formed areas on their respective surfaces facing each other; and
   said first external terminal and the another external terminal are formed on said first element formed area.

9. A semiconductor device comprising:
   a first chip having a first element formed area and a first external terminal;
   a wiring layer disposed on said first chip; and
   a second chip disposed on said wiring layer, being smaller than said first chip, and having a second element formed area and at least one second external terminal,
   wherein said wiring layer comprises:
   an interconnection part electrically connecting the first and second element formed areas of said first and second chips; and an external connection part connected to said second external terminal; and a projection part projecting outward from an outer periphery of said second chip, wherein said external connection part includes said first external terminal which is formed on the surface facing said second chip and is connected to said second chip via a conductive connection member, wherein said second chip includes an internal joint terminal formed on the surface facing said first chip and connected to said conductive connection member, said internal joint terminal electrically connected to said second external terminal formed on a surface opposite to the surface facing said first chip via a first through hole, and wherein said first external terminal is connected to an outside of the semiconductor device via said external joint terminal.

10. The semiconductor device according to claim 9, wherein: said first chip is a memory chip;

said second chip is a logic chip;

said logic chip has a plurality of second external terminals; and at least one of said second external terminals is a power supply terminal.

11. The semiconductor device according to claim 9, wherein: said first chip is a logic chip;

said second chip is a memory chip;

said memory chip includes a test circuit which is prohibited from operating during a normal operation mode and operates in response to a test signal during a test mode to test an internal circuit, the test signal being supplied to said second external terminal from an exterior of the semiconductor device via said external connection terminal; and the internal circuit of said memory chip operates in response to a signal supplied from said logic chip via said interconnection part during the normal operation mode, and operates under control of said test circuit during the test mode.

* * * * *